(12) United States Patent　　(10) Patent No.:　　US 6,303,253 B1
Lu　　(45) Date of Patent:　　Oct. 16, 2001

(54) HIERARCHY AND DOMAIN-BALANCING METHOD AND ALGORITHM FOR SERIF MASK DESIGN IN MICROLITHOGRAPHY

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/526,856

(22) Filed: Mar. 16, 2000

(51) Int. Cl.[7] ............................. G03F 9/00; G06F 17/50
(52) U.S. Cl. .................................. 430/5; 716/19
(58) Field of Search ................... 430/5, 30; 716/19, 716/20, 21

(56) References Cited

U.S. PATENT DOCUMENTS

| | | |
|---|---|---|
| 4,902,899 | 2/1990 | Lin et al. ..................... 250/492.1 |
| 5,631,110 | 5/1997 | Shioiri et al. ..................... 430/5 |
| 5,801,954 | 9/1998 | Le et al. ..................... 364/488 |
| 5,804,340 | 9/1998 | Garza et al. ..................... 430/5 |
| 5,821,014 | 10/1998 | Chen et al. ..................... 430/5 |
| 5,862,058 | 1/1999 | Samuels et al. ..................... 364/491 |
| 5,871,874 | 2/1999 | Tounai ..................... 430/30 |
| 6,127,071 | * 10/2000 | Lu ..................... 430/5 |

* cited by examiner

Primary Examiner—S. Rosasco
(74) Attorney, Agent, or Firm—McGinn & Gibb, PLLC; Richard M. Kotulak, Esq.

(57) ABSTRACT

A structure and method for performing optical proximity correction in photolithographic masks includes defining a hierarchy of inner bands adjacent and inside edges and ends of a mask structure within the photolithographic mask, defining a hierarchy of outer bands adjacent and outside edges and ends of said mask structure changing a transparency of part of the inner and outer bands for the mask structure to correct for optical proximity errors using predefined transparency changes, determining whether the predefined transparency changes affect the outer band of the mask structure or outer bands of other mask structures on the photolithographic mask, and altering the predefined transparency changes to prevent the predefined transparency changes from affecting the outer band and the outer bands. Domain-balancing method and algorithm are used to decide the position, shape, and size of serifs and holes in the predefined transparency changes.

28 Claims, 29 Drawing Sheets

HIERARCHY AND DOMAIN-BALANCING METHOD AND ALGORITHM FOR SERIF MASK DESIGN IN MICROLITHOGRAPHY

BACKGROUND OF THE INVENTION

1. Field of the Invention

The present invention generally relates to photolithographic processing for a mask layout and more particularly to an improved method which eliminates optical proximity effects such a rounding of corners and line end foreshortening etc. through an improved hierarchy and domain-balanced serif mask design system and method.

2. Description of the Related Art

Microlithography is the technology of reproducing patterns using light. As presently used in the semiconductor industry, a photomask pattern for a desired circuit is transferred to a wafer through light exposure, development, etch, and resist strip, etc. As feature sizes on a circuit become smaller and smaller, the circuit shape on the wafer differs from the original mask pattern more and more. In particular, corner rounding, line end foreshortening, iso-dense print bias, etc. are typically observed. These phenomena are called optical proximity effects.

One of the main reasons for optical proximity effects is light diffraction. Optical proximity effects coming from light diffraction can be overcome partly by using a shorter wavelength source of light, with a projection system possessing a larger numerical aperture. In practice, the wavelength of an optical light source is typically fixed (365 nm for i-line, 248 nm and 193 nm for DUV, 157 nm, etc.) and there is a practical upper limit on numerical aperture. So other resolution enhancement methods, including the use of phase-shifting masks and masks with serifs, have been developed to correct optical proximity effects.

SUMMARY OF THE INVENTION

It is, therefore, an object of the present invention to provide a structure and method for performing optical proximity correction in photolithographic mask layout that includes defining an inner band adjacent a mask edge within the photolithographic mask, defining an outer band adjacent that inner band, changing a transparency of part of the inner band and the mask structure to compensate for optical proximity effects using predefined transparency changes, determining whether the predefined transparency changes affect the outer band of the mask structure or outer bands of other mask structures on the photolithographic mask, and altering the predefined transparency changes to prevent the predefined transparency changes from affecting the outer side band and the outer bands.

The predefined transparency changes can include forming a square hole within the mask structure at interior right angles or forming a square serif external to the mask structure at exterior right angles. A serif has the same transparency as the mask structure. A hole has an opposite transparency as the mask structure.

The altering can include changing a transparency of part of the mask structure and regions adjacent the mask edge to form a negative complementary image along each edge of the structure. The altering may also identify quadrants around corners of the mask structure and change a transparency of the quadrants to form mirror images between diagonal quadrants. The altering can include adding a series of hole regions internal to the mask structure and parallel to an edge of the mask structure. The series of hole regions can decrease in size depending upon a positional distance from a corner of the mask structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
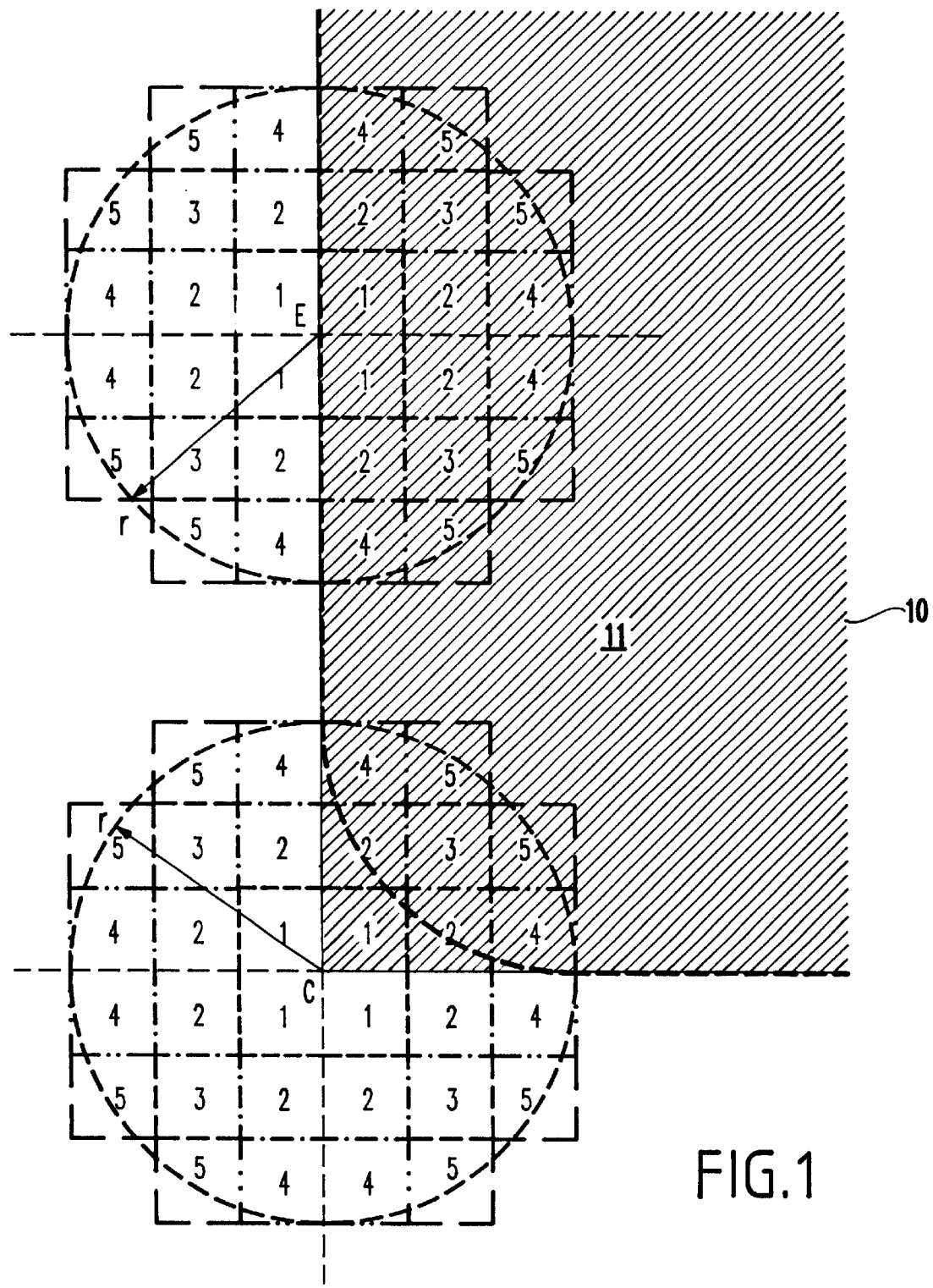
FIG. 1 is a schematic architectural diagram illustrating part of a mask and corner rounding.

Referring now to the drawings, FIG. 1 shows a corner C of a large mask 10 as well as a corresponding aerial image (after light exposure) or the final photoresist pattern after further development, etch, and resist strip, etc. as a dashed line. Corner rounding is clear at corner C as shown by the dashed line. The following explanation presents a simple geometric picture for understanding the corner rounding shown in FIG. 1. Without loss of generality, it is assumed in the following discussion that the mask is a negative mask so that the clear (i.e., transparent) region 11 of the mask is inside the mask (and serifs).

For incoherent light illumination (using either circular or rectangular aperture), the aerial image intensity at a point is given by the convolution between the intensity kernel function and the transmitted light intensity around the point, and is proportional to the volume of a truncated cone-type 3D structure. The whole cone-type structure represents the intensity kernel function on a 2D region and is centered at that point and has a horizontal range r. The horizontal range is related to the resolution of a photolithographic system. The truncation is done according to the actual light transmission around that point, which may be blocked by any opaque region in the photomask. For an edge point E (when the distance to its nearest corner is larger than r), after truncation, its volume is half of the whole volume under the intensity kernel function (i.e., half of the whole volume of the 3D cone-type structure). For the corner C, after truncation, its volume is ¼ of whole volume under the intensity kernel function. Thus, the aerial intensity of C $I_C=\frac{1}{2}I_E<I_E$, independent of the range r and the form of the intensity kernel function. The aerial intensity contour line (or resist pattern) passing through the edge point E will not pass through the corner C; Rather, it passes inside the corner C (see the dashed curve in FIG. 1). This is the primary cause of corner rounding.

The aerial image intensity I can also be calculated by counting the number of nearby small squares (pixels) that exposure light passes through and the relative contributions of those pixels. For either edge point E or corner C, in the shaded region of FIG. 1, pixels labeled "1" at different locations near it give the same contribution, pixels labeled "2" at different locations near it provides the same contribution, etc. Among different pixel groups, a pixel "1" (a level-1 pixel) contributes more than a pixel "2" (a level-2 pixel), which in turn contributes more than a pixel "3" (a level-3 pixel).

Using this method (which, in one embodiment, is within software), the invention counts how many level-1 pixels contribute to edge point E (2 pixels) and to corner C (1 pixel), how many level-2 pixels add to the intensity at edge point E (4 pixels) and to the intensity at corner C (2 pixels), and how many level-3 pixels make contribution to the edge point E (2 pixels) and to the corner C (1 pixel). Since the edge point E gets contribution from more nearby pixels (for each level of pixels) than the corner C does, the invention says that $I_E > I_C$. This simple geometric picture and conclusion applies also to coherent light illumination, where the square of a convolution replaces the simple convolution for incoherent light illumination, and to partial coherent light illumination.

Figure 2:
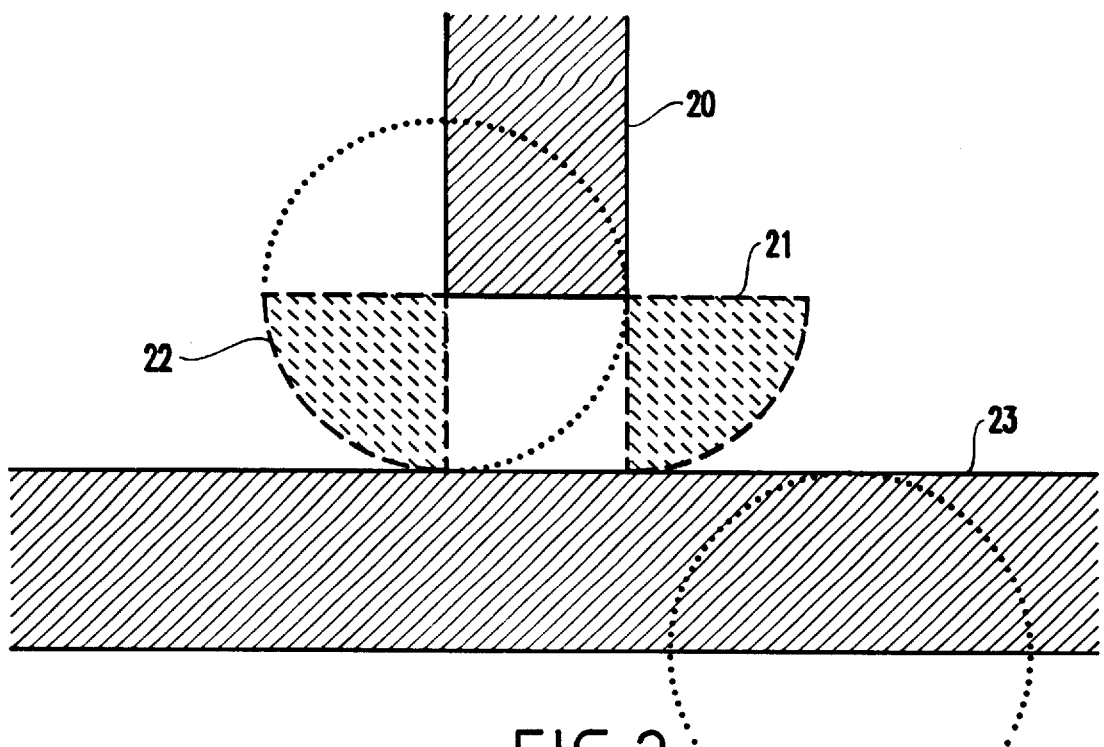
FIG. 2 is a schematic architectural diagram illustrating serifs connecting to a nearby wire.

Referring now to FIG. 2, for an isolated wire 20, correcting corner rounding and line end foreshortening can be achieved by properly placing two quarter circle serifs 21, 22, as explained fully in U.S. patent application Ser. No. 09/167, 948, incorporated herein by reference. However, if there is another line 23 near the end of first wire 20, then the two quarter circle serifs 21, 22 would connect the two wires, which is certainly not desirable. The invention described below overcomes this problem.

Figure 3:
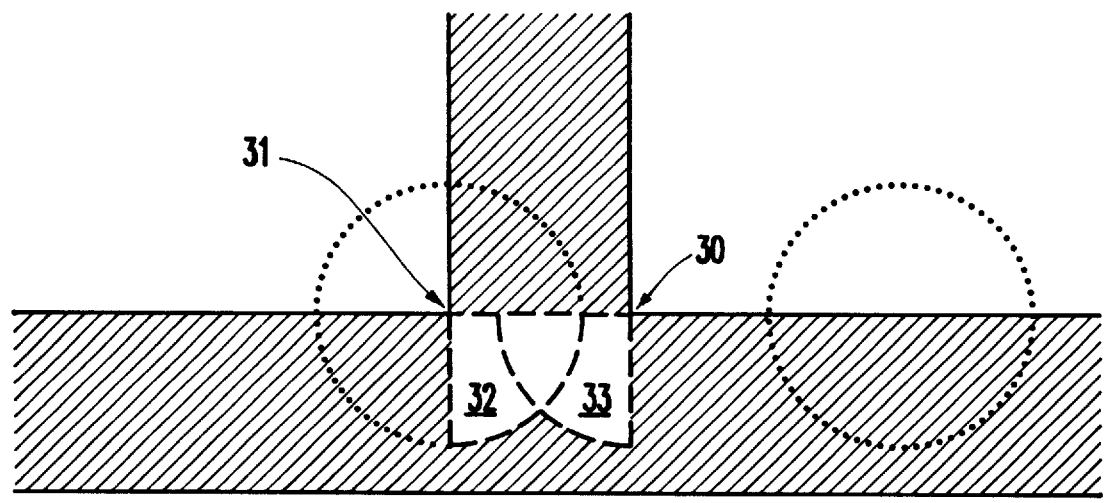
FIG. 3 is a schematic architectural diagram illustrating two ¼ circle holes connected to form a large hole.

Similarly, referring to FIG. 3, another example of two close features is the two inner corners 30, 31 in an inverted "T" shape wire. The corner correction scheme disclosed in U.S. patent application Ser. No. 09/167,948, discussed above, would place two ¼ circle holes 32, 33. However, these holes 32, 33 would become connected to form a large hole which would appear in the resist pattern, which again is certainly not desirable. The invention described below solves this problem.

More specifically, the invention presents a methodology and corresponding system for serif mask design. Note that, for a negative mask, a "hole" is an opaque (e.g., non-transparent) region and a serif is a transparent region in a photolithographic mask design. The invention approaches the serif mask design problem using a hierarchy methodology. Also, the invention includes a method of "domain balancing", for achieving the best serif mask design for a given circuit layout.

The closely spaced wires in FIGS. 2 and 3 will be used as examples to illustrate the inventive serif mask design methodology and algorithm. The invention accomplishes the task of optical proximity correction (OPC) (e.g., to correct the corner rounding and line end shortening, etc.) better than conventional systems, and the invention is suitable for use in a CAD software. The invention can make OPC for mask shapes shown in this disclosure as well as for many other serif mask design situations.

In the following, r is a kernel function's effective range and is typically related to resolution of the lithographic system. In a local coordinate system which centers at the point under consideration for calculating its aerial image, the kernel function K is substantially zero when its argument is larger than r. For incoherent light illumination, r can be the range of a combined kernel function for both optical imaging process (which leads to aerial image) and subsequent etch and resist development processes (assumed to be a convolution process, e.g., a simple diffusion process). Note that, for severe optical proximity effects, r can be larger than the wire width w.

Each semiconductor technology (say, 0.35 μm, 0.25 μm, 0.18 μm, 0.13 μm, 0.10 μm, etc.) has a grid size and a pitch for a given level (RX, MC, M1, M2, . . . , MT, MZ, LM, etc.). Optical proximity effects are most severe in PC, MC, and lower metal levels, since smaller pitches are used for these levels. The ratio of minimum wire (design) width or space to grid size typically ranges between 10 to 20. A grid divides a design space into many pixels or bitmaps. For a crown-on-glass mask, each pixel is either filled or empty ( i.e., transparent or opaque). A grid point (the smallest square in a design layout) represents the minimum manipulation elements.

Since ground rules set different minimum wire widths and minimum spaces for different levels (RX, MC, M1, M2, etc.), and different steppers may be used for lithography on different levels, the following inventive procedure is applied to each metal level respectively for which OPC is wanted.

First, the invention determines the effective range r and, optionally, the shape of the kernel function K for a given level (PC, MC, M1, M2, etc.). The invention rounds off r to a multiple integer of grid size. For example, the effective range r can be determined based on lithography light wavelength, numerical aperture, and partial coherence σ. As an alternative, the invention may determine r from actual or projected corner rounding radius on a large rectangle mask.

Figure 4:
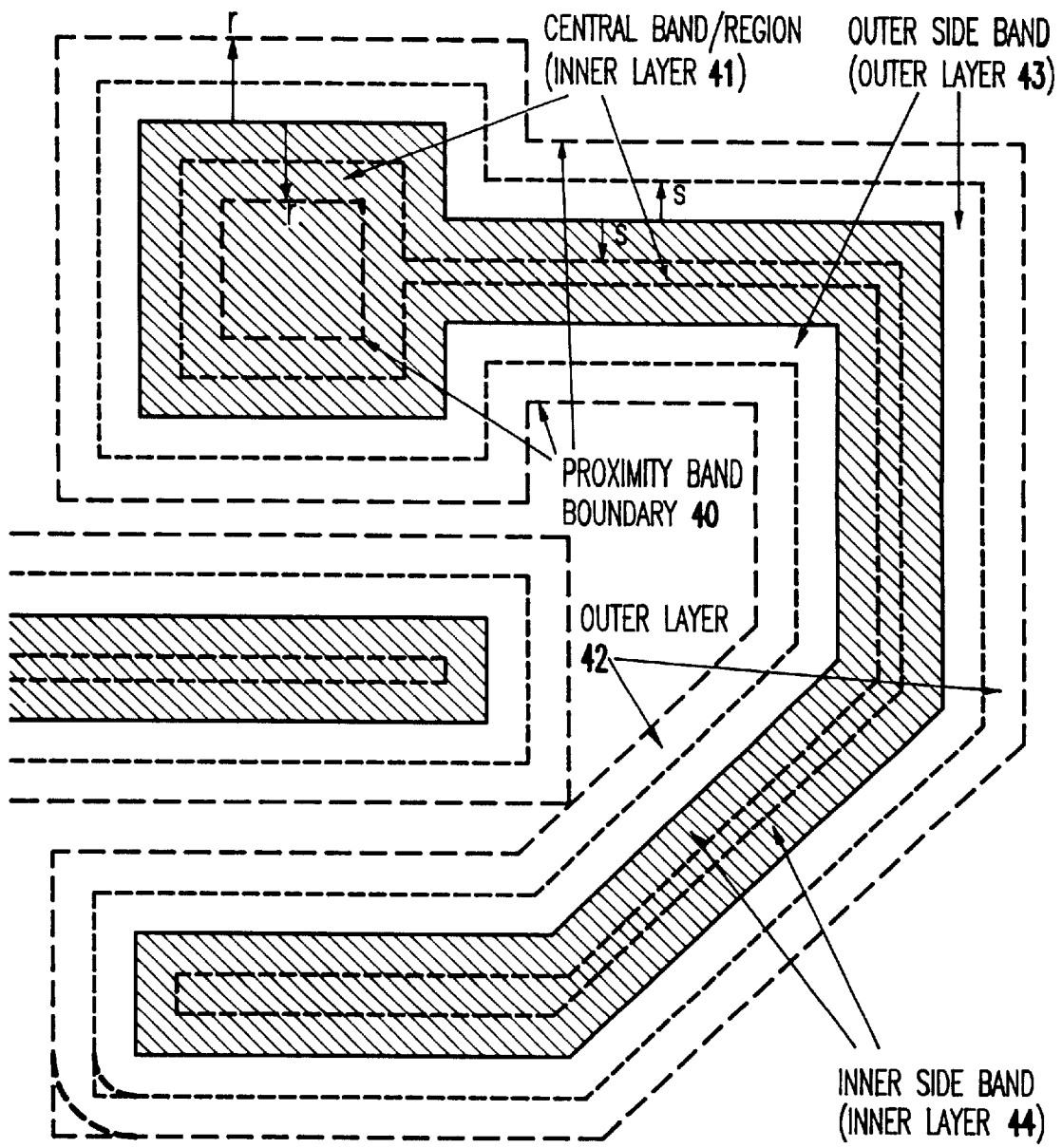
FIG. 4 is a schematic architectural diagram illustrating hierarchy layers along wire edges.

Secondly, as shown in FIG. 4, the invention draws two proximity bands 40 of width r, one inside the wire and the other outside the wire, along each and every wire edge and wire end. For a wire of width w, two inner proximity bands for two edges of the wire will cover all area inside the wire when r>½w.

Thirdly, for a given level (PC, MC, M1, M2, etc.), based on the minimum wire width/space of the level and grid size, the invention calculates the band width s of side bands 43–44 discussed below in the following paragraph. The side band width s equals one or more integer number of grid size, and is less than or equal to half the minimum wire width of the given level, s≦½w. A preferred choice is to let the side band width s be larger than or equal to the width w−2s of the central band region 41 for a minimum width wire.

The following table provides preferred choices for grid numbers ranging from 2 to 15. They are classified into 4 groups. In group A, w−2s=0, i.e., s=w/2. In group B, w−2s=s, i.e., s=⅓w. In group C, w−2s<s, i.e., S>⅓W. In group D, w−2s>s, i.e., s<⅓W. For even larger grid number within wire width, the division rule chooses the ratio of central band width to side band width, (w−2s):s, between 0.5:1 and 1:1.

| Mininium wire width w, in unit of grid size | Left/lower edge band width s | Central band size w−2s | Right/upper edge band width s | Equivalency | Group |
|---|---|---|---|---|---|
| 2 | 1 | 0 | 1 | a | A |
| 3 | 1 | 1 | 1 | b | B |
| 4 | 2 | 0 | 2 | a | A |
| 5 | 2 | 1 | 2 | c | C |
| 6 | 2 | 2 | 2 | b | B |
| 7 | 2 | 3 | 2 | | D |
| 7 | 3 | 1 | 3 | e | C |
| 8 | 3 | 2 | 3 | | C |
| 9 | 3 | 3 | 3 | b | B |
| 9 | 4 | 1 | 4 | | C |
| 10 | 3 | 4 | 3 | | D |
| 10 | 4 | 2 | 4 | c | C |
| 11 | 4 | 3 | 4 | | C |
| 12 | 4 | 4 | 4 | b | B |
| 12 | 5 | 2 | 5 | | C |
| 13 | 5 | 3 | 5 | | C |

-continued

| Mininium wire width w, in unit of grid size | Left/lower edge band width s | Central band size w-2s | Right/upper edge band width s | Equivalency | Group |
|---|---|---|---|---|---|
| 13 | 4 | 5 | 4 | | D |
| 14 | 5 | 4 | 5 | | C |
| 14 | 6 | 2 | 6 | e | C |
| 15 | 5 | 5 | 5 | b | B |
| 15 | 6 | 3 | 6 | c | C |

In a fourth processing stage, the invention draws two side bands 43, 44 of width s, one 43 inside the wire and the other 44 outside the wire, along each and every wire edge and wire end.

In a fifth processing stage, if r>s, the invention generates an outer layer 42 by a Boolean operation where the outer layer 42 is the difference between the proximity band 40 and the outer side band 43, and generates a central band region 41 by another Boolean operation where the central band 41 is the difference between the proximity band 40 and the inner side band 44. The central band/region 41 is so named because it is usually the band between two inner side bands 44. ( In certain cases, the width of the central band 41 can be zero). Both the central band 41 and the outer layer 42 are also called layer 2.

In a sixth processing stage, for each outer or inner corner, the invention draws an "ideal" serif mask, without considering whether or how it will affect or will be affected by neighboring masks. There are only a few common corner cases: 90-degree outer corner, 90-degree inner corner, 45-degree outer corner, and 45-degree inner corner. For both 90-degree outer and inner corners the ideal serif mask design (includes holes) for each type of corner is known, and are disclosed in U.S. patent application Ser. No. 09/167,948. U.S. Pat. No. 6,214,494. For both 45-degree outer and inner corners, the ideal serif designs (including holes) for each of them are disclosed in a recent U.S. patent application filed by IBM Corp. now U.S. Pat. No. 6,280,887 serif mask optimization (such as exchanges to make serifs themselves not printable, discussed below) can either be done at this stage or at a later stage. In any case, the serif masks will all be within the proximity-range band 40. This ideal serif mask design can be held in a temporary mask data storage space, or be held in a case library to save data space.

In a seventh processing stage, the invention performs the OPC within side bands 43, 44. This is accomplished by performing the Boolean operation intersection (i.e., AND) between the side bands 43, 44 and the "ideal" serif mask. The result of this Boolean operation is also held in a temporary data storage space.

In an eighth processing stage, the invention checks certain edge points (for example, edge points whose distances from a corner is an integer multiple of s or of grid size) to make sure that OPC is correctly performed within the side bands 43,44.

In a ninth processing stage, the OPC is performed in both the outer layer 42 and the central band/region 41, without considering how this would affect the other edge or other nearby wire edges. Similar to the seventh processing stage discussed above, this can be accomplished by the Boolean operation intersection (i.e., operation AND) between outer layer 42/ central band 41 and the "ideal" serif mask design. The result of this Boolean operation is also held in a temporary data storage space.

In a tenth processing stage, for each temporary serif or hole in the central band 41 and outer layer 42, the invention determines whether such a temporary serif or hole affects the balance of the other edge. Once again, the effective range is r. If the serif/hole does not affect the other edge, the invention makes this serif or hole permanent. Otherwise, the invention balances the nearby mask design. Methods of "mirroring and reversing" and of "domain balancing" (discussed below) can be used to perform such balancing. When the balancing is complete, the invention makes the changes permanent.

In an eleventh processing stage, the invention treats serifs and holes in both the outer side band 43 and the outer layer 42, and treats serifs and holes in both the central band 41 and the inner side band 44. When put together, a serif or hole may become too large and may become printable itself, which is not desired. Therefore, the invention uses an exchange method (explained below) or a more complex domain balancing method (also explained below) to make serif/holes no long printable. Usually, the exchange occurs near a corner and involves part of both inner and outer side bands.

In a twelfth processing stage (as a final check), the invention samples points within wires to make sure that their intensities are larger than a corresponding edge intensity. Also, sample points outside wires can be examined to ensure that their intensities are less than the edge intensity.

As briefly mentioned above, one of the methods the invention uses is a mirroring-and-reversing method. The mirroring-and-reversing method not only helps to balance the mask design, but also quickly achieves constant intensity along edges and corners of a mask, without using the specific shape of a kernel function.

More specifically, a new photomask design methodology—called complementary and exchange mask design methodology—is used to accomplish OPC in microlithography. The invention uses the elbow shape mask as an example to present this new methodology while showing how to correct medium to severe corner rounding. As will be seen, the new methodology accomplishes the OPC task (e.g., to correct the corner rounding) better. The new method can help to find the limit of OPC and the tradeoff for any optimization work the OPC might evolve.

The invention discussed below discloses how to design serif masks to perfectly correct corner rounding for both 45- and 90-degree corners, without printing serif/hole features. The invention also includes (1) an exchange feature and (2) a set of serif mask design rules—called "mirroring-and-reverse"—for optical proximity correction in photolithography. The following uses the 45-degree turn and the usual 90-degree-angle corner as examples to present these serif mask design rules and corresponding methodology. However, the invention is not limited to these two shapes and, as would be known by one ordinarily skilled in the art given in this disclosure, the invention is applicable to any similar shape.

Specifically, the invention addresses the situation of r>w/2, where w is the wire width (typical feature size), and r is the kernel function's effective range. Namely, in a local coordinate system which centers at the point under consideration for calculating its aerial image, the kernel function K is substantially zero when its argument is larger than r: $K(x, y)=0$ when x>r and/or y>r for square aperture, and $K(\rho)=0$ when $\rho$>r for circular aperture. For incoherent light illumination, r can be the range of combined kernel function for both optical imaging process (which leads to aerial image) and subsequent etch and resist development processes (assumed to be a convolution process, e.g., a simple diffusion process), in which case $I_E$, $I_C$, $I_L$, and $I_M$ in the following represent the final resist pattern. For simplicity, it is also assumed that r is less than or equal to the wire width in the following.

This disclosure first considers the situation involving square aperture. For the square aperture, the following symmetry properties usually exist:

$$K(x, y)=K(|x|, |y|)=K(y, x)$$

The invention corrects corner rounding at both inner and outer corners perfectly and simultaneously using two complementary design rules:

Complementary design rule 1. An edge line serves as a "complementary symmetry" line. Any part missing on one side of the "complementary region" should be compensated by adding its mirror image on the other side of the complementary region (if possible). Also, any extra part on one side of the complementary region should be complemented by taking out its mirror image part on the other side of the complementary region (if possible). Here, a complementary region is defined as a strip region of width min (r, w) on one side of the edge line.

Complementary design rule 2. Two perpendicular edge lines meeting at a corner and their extensions divide the region around the corner into 4 quadrants. Each quadrant is of size min (r, w) x min (r, w). Any part missing in one quadrant should be compensated by adding a similar part in one of other quadrants (if possible). Similarly, any extra part in one quadrant should be complemented by cutting out a similar part in one of other quadrants (if possible).

In other words, the first complementary design rule provides that the transparency of the mask along the edge of the shape is changed to establish complementary (e.g., negative image) symmetry for the width r along each edge of the shape. The second complementary design rule provides that the transparency of quadrants around each corner of the shape is changed to form mirror image diagonal quadrants centered on the corners of the shape.

More specifically, with respect to the first complementary design rule, a complementary symmetry line is an edge line of the original design element. A complementary region is defined as a strip region of width r within the shape along the edge line. The transparency of portions along the complementary region are complemented by opposite transparency (e.g., negative image) portions on the other side of the complementary symmetry line (e.g., along the area of the mask external to the complementary region).

Therefore, transparent portions along the complementary region are complemented with identical non-transparent portions external to the shape on the other side of the complementary symmetry line and portions along the complementary region are complemented with identical transparent portions external to the shape on the other side of the complementary symmetry line.

Figure 12:
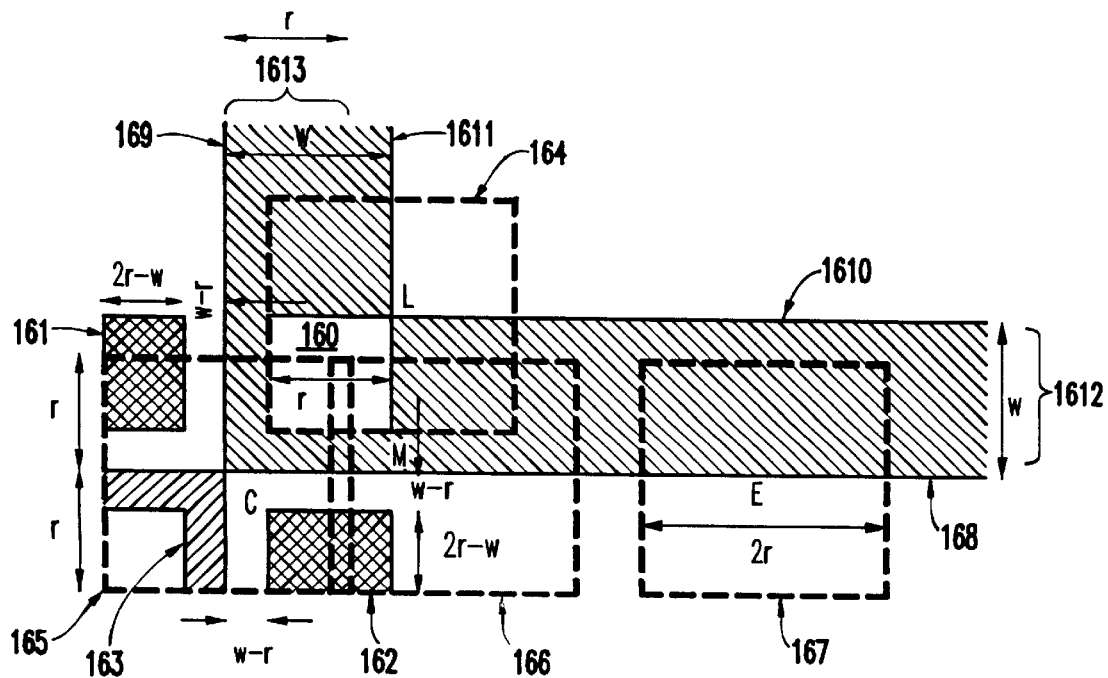
FIG. 12 is a schematic architectural diagram of a mask useful with a square aperture when w/2<r<w.

For example, two complementary symmetry lines which would be selected are shown as items 168 and 169 in FIG. 12. FIG. 12 shows a serif photomask design for the case of w/2<r<w. The invention starts the serif design process by keeping the square hole 160 of size rxr at the inner corner L to make $I_L=I_E$ first. The invention ends the OPC process with 3 serifs 161–163 near the outer corner C. Two of the serifs 161–162 are detached rectangles and one of the serifs 163 has a right-angle-turn shape.

With reference to the lower horizontal complementary symmetry line 168, the complementary region includes a strip of the shape which is the distance r from the complementary symmetry line 168. This strip (e.g., complementary region 1612) is bordered by the complementary symmetry line 168 along the lower image and by a line formed by the top of the boxes 165–167.

The first rule requires that a masked (unmasked) region complement any unmasked (masked) region within the complementary region 1612. Serif 162 performs this function by providing a complement for a portion of the square 160 that is within the distance r from the complementary symmetry line 168. The width of the serif 162 is equal to r and the height is equal to (2r−w). It is also important to note that the unmasked region between serif 162 and complementary symmetry line 168 is the complement for the portion of the shape between the complementary symmetry line 168 and the square 160. Similarly, the remaining unmasked area adjacent the complementary symmetry line 168 is the complement for the masked portion of the shape that is within the complementary region 1612. Similarly, applying the first complementary design rule creates a complementary region (e.g., strip) 1613 adjacent to the vertical line 169. Serif 161 is the complement for the portion of the opening 160 which resides within the complementary region 1613 adjacent to the complementary symmetry line 169. Note that application of the first complementary design rule to lines 1610 and 1611 does not produce any complementary serif structures.

The original hanging square serif of size rxr at the outer corner C has a small square region of size (2r−w)x(2r−w) removed. This removal is based on the second complementary design rule mentioned above.

With the second complementary design rule, two perpendicular edge lines meeting at a corner and their extensions divide the region around the corner into four equal quadrants. Each quadrant is of size rxr. Any part missing (or extra part) in one quadrant should be compensated by adding (or removing) a similar part in one of other quadrants to create proper mirror images among four quadrants. More specifically, the transparency of the diagonal quadrants adjacent a corner of the shape are changed to balance and mirror all the quadrants adjacent the corner.

The second complementary design rule is applied to FIG. 12 as follows. Box 165 is divided into four quadrants surrounding point C. The lower left quadrant includes a serif 163 which is a mirror image of the masked material within the upper right quadrant of box 165. Similarly, the smaller unmasked square within the lower left quadrant matches the portion of the square 160 which lies within the upper right quadrant of box 165. The upper left quadrant and lower right quadrant are already balanced (as a result of the application of the first complementary design rule) and are not changed by the second complementary design rule.

The masked areas (or unmasked areas) within the four dashed-line bigger squares 164–167 are the same. More importantly, total volumes of 3D cone structures within four dashed-line squares 164–167 are equal, independent of the specific shape of kernel function K(x, y). This provides equal aerial intensity (i.e., $I_C=I_L=I_M=I_E$) for both incoherent and coherent light illuminations, independent of the shape of their kernel function. Notice that the edge point M in FIG. 12 can be anywhere on the outer edges or anywhere on the inner edges.

Figure 13:
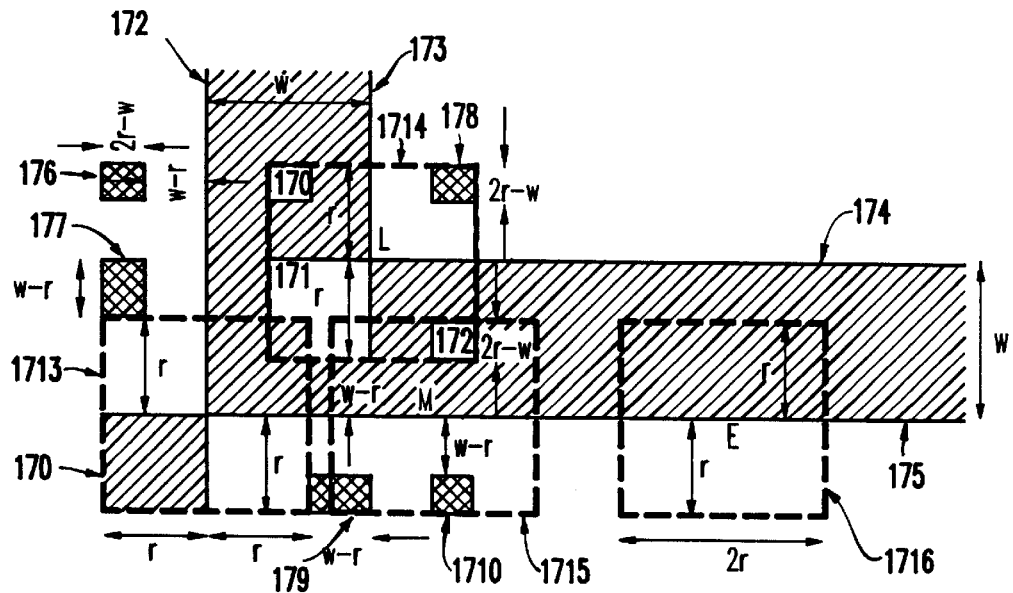
FIG. 13 is a schematic architectural diagram of a mask useful with a square aperture when w/2<r<w.

FIG. 13 illustrates another serif photomask design that is based on the same complementary design rules mentioned above. FIG. 13 illustrates another embodiment of the invention where the serif design process starts by keeping the square serif 170 at the outer corner C to get $I_C=I_E$ first. The first and second complementary design rules are applied to complete the OPC process with 3 holes and 5 additional detached rectangular serifs.

More specifically, the first complementary design rule is applied to the shape shown in FIG. 13 to create complimentary regions corresponding to the complementary symmetry lines 172 and 175. The application of the first rule to complementary symmetry line 172 forms serifs 176 and 177, as discussed above. A similar application of the first complementary design rule to complimentary symmetry line 175 produces serifs 179 and 1710.

Then, as with FIG. 12, the second complementary design rule forms 4 quadrants within box 1713 surrounding point C. This embodiment is different than the previous embodiments in that the upper right quadrant is modified to be a mirror image of the lower left quadrant. Therefore, in this embodiment, the square 171 is modified with the addition of a smaller square of masked material in the lower left corner of square 171 to make the upper right quadrant of box 1713 a mirror image of the lower left quadrant. Further, the second complementary design rule is also applied to point L. The smaller masked square added to square 171 requires the addition of serif 178 to provide proper symmetry according to the second complementary design rule.

Finally, with the placement of the serif 178 outside the complementary symmetry lines 173 and 174, the first complementary design rule is applied to complementary symmetry lines 173 and 174 to form additional openings 1711 and 1712. Therefore, in specific situations, the invention can apply and reapply the first and second complimentary design rules in a continuous repetitive fashion until each of the rules makes no further changes to the shape. In other words, the invention repeats the application of the complementary design rules as the shape of the design changes to ensure that the final design complies with all complementary design rules.

As with the squares in FIG. 12, the masked areas (or unmasked areas) within four dashed-line bigger squares 1713–1716 in FIG. 13 are the same. Moreover, total volumes of 3D cone structures within four dashed-line squares are equal, independent of the specific shape of kernel function K(x, y). This proves equal aerial intensity (i.e., $I_C=I_L=I_M=I_E$) for both incoherent and coherent light illuminations, independent of the shape of their kernel functions. Note that the edge point M in FIG. 13 can also be anywhere on the outer edges or anywhere on the inner edges. This means complete and simultaneous corner rounding correction at both inner and outer corners.

Figure 14:
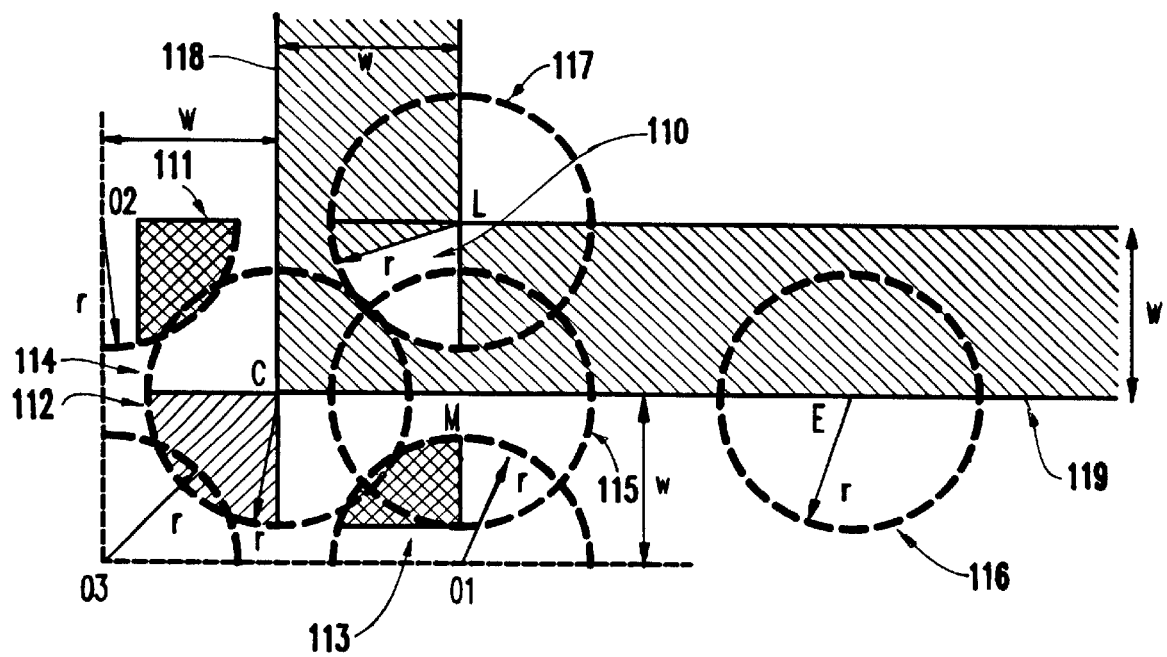
FIG. 14 is a schematic architectural diagram of a mask useful with a circular aperture when w/2<r<w.

Referring now to FIG. 14, an ideal serif photomask design for the case of w/2<r<w is illustrated. Similarly to FIG. 12, the invention starts the serif design process by keeping the quarter-circle hole 110 of radius r at the inner corner L to make $I_L=I_E$ first. Using the above complementary design rules, the design process ends with 3 serifs 111–113 near the outer corner C. More specifically, the first complementary design rule creates complementary regions adjacent complementary symmetry lines 118 and 119, and adds serifs 111 and 113, as discussed above. The second complementary design rule is applied to create quadrants around Point C and add serif 112 to provide symmetry between the lower left quadrant and the upper right quadrant, as discussed above.

As with the previous illustrations, the masked areas (or unmasked areas) within four big circles 114—117 are the same. More importantly, total volumes of 3D cone structures within four big circles are equal, independent of the specific shape of kernel function K(r). This implies equal aerial intensity (i.e., $I_C=I_L=I_M=I_E$) for both incoherent and coherent light illuminations, independent of the shape of their kernel functions. Notice that, again, the edge point M in FIG. 14 can be anywhere on the outer edges or anywhere on the inner edges. Thus, the invention achieves perfect and simultaneous corner rounding correction at both inner and outer corners.

Comparing FIG. 14 with FIG. 12, it can be seen that each of two detached serifs in FIG. 14 is the result of an intersection (a Boolean operation) between the original rectangular serif of size r×(2r−w) (see FIG. 12) with a circle of radius r centered at O1 or O2. Note that circle center O1 (O2) is the mirror image of the inner corner L along the edge line 119 (118). The dashed-line circle of radius r which centers at O3 cuts off a part from the quarter-circle serif centered at the outer corner C if and only if r>0.707w.

The above exchange method can also be applied to the 90-degree structure discussed above, as shown in FIG. 15. In a manner similar to that discussed above, the invention first considers square aperture, for which the kernel function K(x, y) obeys the symmetry properties given in eq. (1), and then considers circular aperture, where the kernel function K(r) is assumed to be angle-independent.

With the invention, portions of the serifs can be exchanged with the shape to make the serif and hole not printable. The purpose of the exchange method is to eliminate the aerial image/resist pattern of larger serifs and holes while maintaining the aerial image/resist pattern at desired wire edges and corners. The specific processes include identifying large serifs and holes around a corner, dividing the area around the corner into 4 quadrants. In the quadrant where the serif or hole resides, the invention reduces the size of a large serif by taking away part of it, or reduces the size of a large hole by filling part of it. In the case of reducing the size of a large serif, the area to be taken away is about ¼ to ⁴⁄₉ of the original serif size. In other words, the side length of a square to be taken away is about ½ to ⅔ of the side length of the original serif. In the case of reducing the size of a large hole, the size to be filled is about ¼ to ⁴⁄₉ of the original hole size. Namely, the side length of the region to be filled within the original hole is about ½ to ⅔ length of the original hole. Then, the invention takes mirroring-and-reversing action with respect to two edge lines of the corner. If this results filling part of a hole in, say, the third quadrant, then the invention forms one small hole in the second quadrant and another small hole of the same size in the fourth quadrant. Finally, the invention applies the mirroring-and-reversing action for the 3rd time and adds another serif in the first quadrant.

The exchange method exchanges two masked small areas in the second and fourth quadrants with two unmasked area in the first and third quadrants. The masked and unmasked areas form mirror images of each other with respect to the two edge lines, which are also complementary symmetry lines in the invention.

Figure 15:
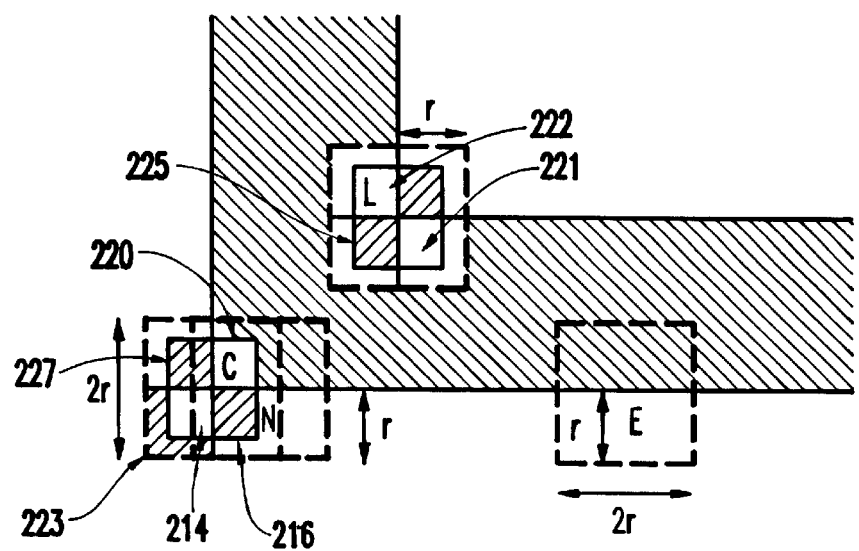
FIG. 15 is a schematic architectural diagram illustrating exchanges within the serifs to prevent the serifs and/or hole from actually being printed.

More specifically, part of square serif (hole) is exchanged with nearby unmasked (masked) region 220 and 224 in FIG. 15, and then the new design is rebalanced according to the above serif mask design rules. FIG. 15 shows the result of simple exchanges discussed above at both inner corner L (e.g., 225 and 221, 222) and outer corner C (e.g., 220 and 224). Since the intensity within the serif structure 223 (near outer corner C) is too large, a smaller square 224 is removed from it. Based on the above serif mask design rules, mirror images 226, 227 are created along both horizontal and vertical edges. Similarly, since the intensity within the hole near the inner corner L is too low, the invention makes the hole smaller by adding opaque region 225, and performs "mirroring-and-reverse" operations in the other 3 quadrants near the inner corner L. Finally, within dashed-line bigger squares in FIG. 15, four different truncations still lead to the same total volume of 3D cone structure, and the invention still produces $I_C=I_L=I_N=I_E$ for both incoherent and coherent light illuminations.

The following discussion concerns the circular-aperture cases. Serif design presented above in FIG. 15, produce equal aerial intensity $I_C=I_L=I_N=I_E$ and thus perfect corner rounding correction (even for circular-aperture cases). The serif's shape, however, can be reduced in size without changing any intensities $I_C$, $I_L$, and $I_N$, (i.e., the invention always maintains $I_C=I_L=I_N=I_E$). Again, the invention reduces the sizes of serifs and holes so that they become less likely to be printable in aerial image/resist pattern. With the invention any part of serif that lies outside the circle which centers at the corner and has a radius r can be safely cut out. Similarly, any part of a hole that lies outside the circle which centers at the corner and has a radius r can be safely filled.

Figure 16:
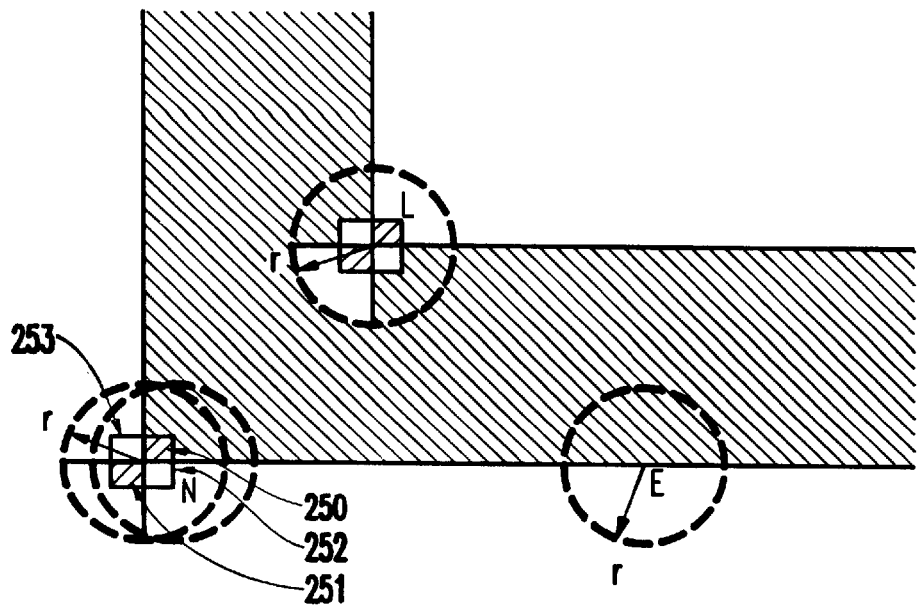
FIG. 16 is a schematic architectural diagram illustrating exchanges within a mask to make quarter-circle serifs and holes not printable.

The invention also directly improves an original quarter-circle serif and hole design to make serif/hole structure disappear in the aerial image/resist pattern by the method of exchange, discussed above. The invention makes simple exchanges in FIG. 16: switching two filled squares 250, 251 in the first and third quadrants with two empty squares 252, 253 in the second and fourth quadrants. The new serif mask design after exchanges is shown in FIG. 16. Within four dashed-line full circles in FIG. 16, different cuts still give the same total volume of 3D cone structure and the invention maintains $I_C=I_L=I_N=I_E$ for both incoherent and coherent light illuminations.

Again, there are many serif mask designs to spread the serif/hole areas to other quadrants around a corner. Thus, mirroring-and-reversing involves defining an edge line that serves as a negative image axis. To obtain the same intensity for each and every point on an edge of a mask shape, mirroring-and-reversing changes the mask pattern's transparency along the edge (e.g., within the proximity band 40) such that each side of an edge is the reverse of the other side. When two edges meeting at a corner, quadrants are defined around the corner and the diagonal quadrants are made mirror images of each other.

When a serif/hole at a corner is too large to become printable, the invention reduces the serif/hole size by exchanging part of the serif/hole in neighboring quadrants. Specifically, the invention exchanges a pair of transparent areas in the 1st and 3rd (or 2nd and 4th) quadrants with a similar pair of opaque area in the 2nd and 4th (or 1st and 3rd) quadrants. After such exchanges, the opaque areas of large serifs/holes are reduced and become non-printable.

As discussed above, the invention also includes a domain-balancing process to achieve optimal serif mask design within a given layer under given restrictions. The domain-balancing method evaluate the best bitmap pattern at grid points as discussed in greater detail below.

Figure 5A:
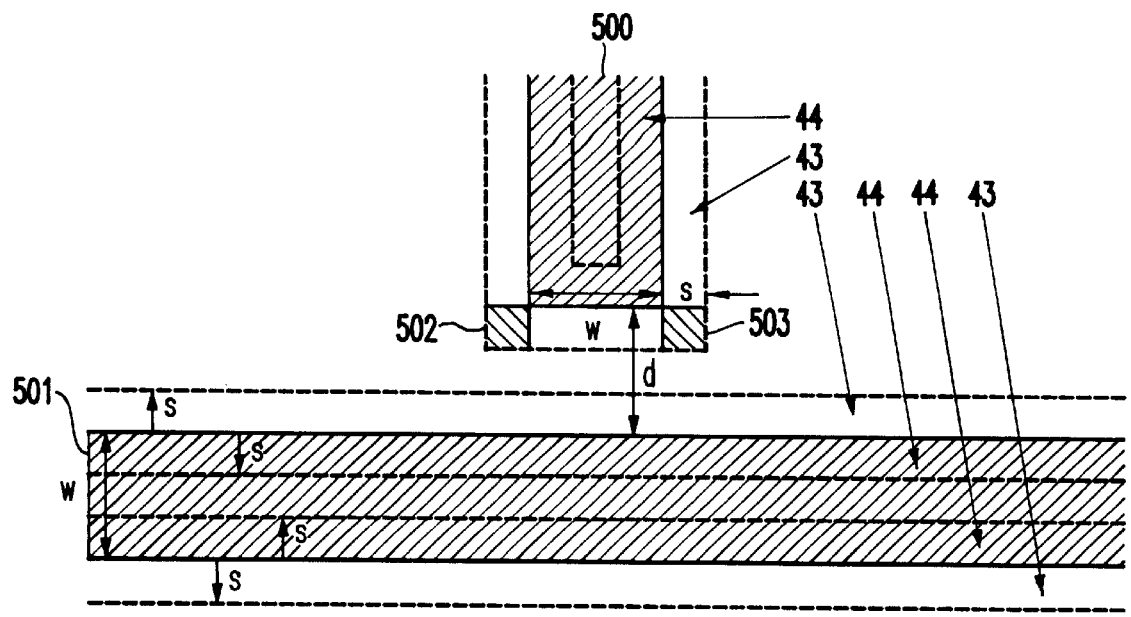
FIG. 5A is a schematic architectural diagram illustrating a side band width s equal to ⅓ of wire width w and space d.
Figure 5B:
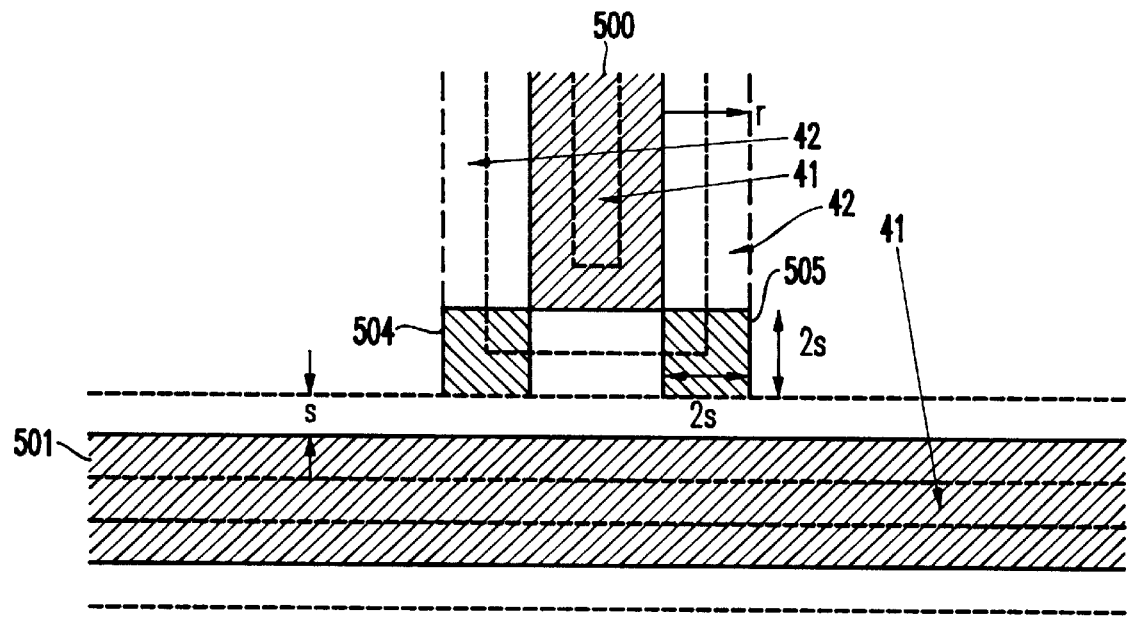
FIG. 5B is a schematic architectural diagram illustrating continued corner rounding correction.

FIG. 5A–10C provide examples of the operation of these aspects of the invention. More specifically, FIG. 5A illustrates two closely spaced wires 500, 501 wherein the side band width s is equal to one-third of the wire width w. Also, the spacing d between the wires 500, 501 is equal to the wire width w. Additionally, the structure shown in FIGS. 5A includes serifs 502, 503 which are the results of the OPC within side bands (7$^{th}$ processing stage). FIG. 5B illustrates a similar situation which includes larger serifs 504, 505, which are the results of the OPC in outer layer, as described above for the ninth processing stage. The serifs becomes larger in FIG. 5B after the ninth processing stage. FIG. 5C illustrates the addition of openings 506, 507 by the mirroring-and-reversing method, as required by the tenth processing stage. More specifically, the edge 508 is selected as a mirroring edge. Then regions 509 and 510 are made to mirror one another. This allows for the creation of holes 506 and 507.

Figure 5C:
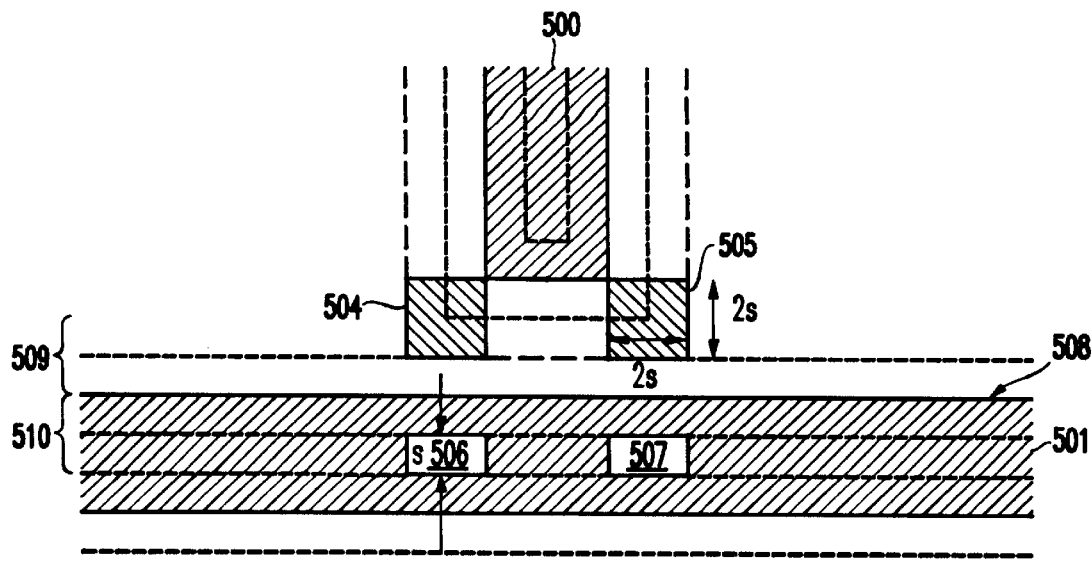
FIG. 5C is a schematic architectural diagram illustrating balancing the mask around the upper edge of the horizontal wire by "mirroring and reversing"
Figure 5D:
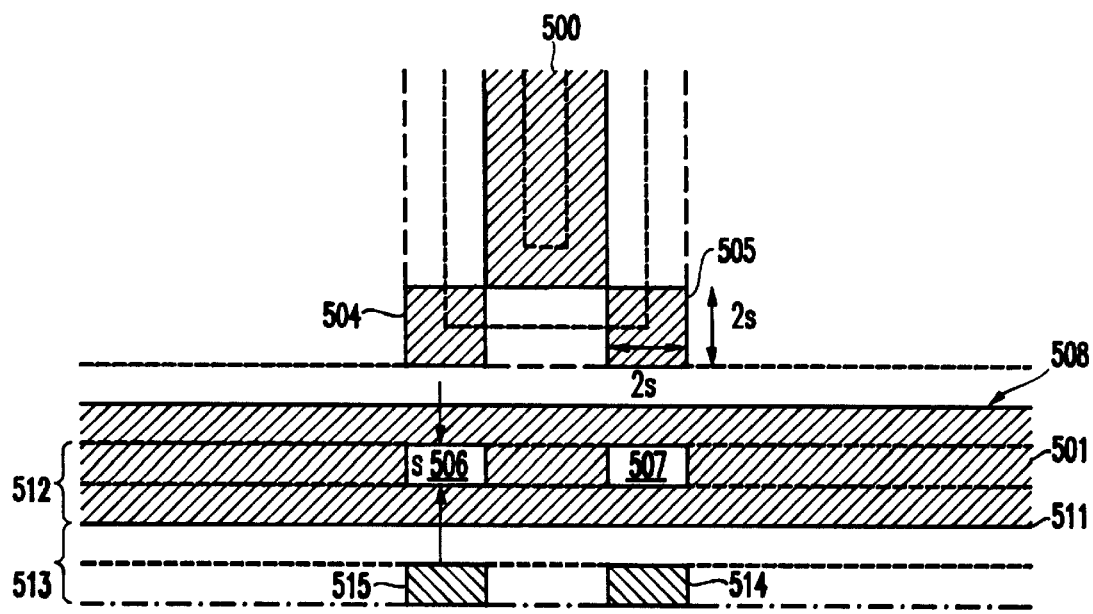
FIG. 5D is a schematic architectural diagram illustrating balancing of the mask around the lower edge of the horizontal wire.
Figure 5E:
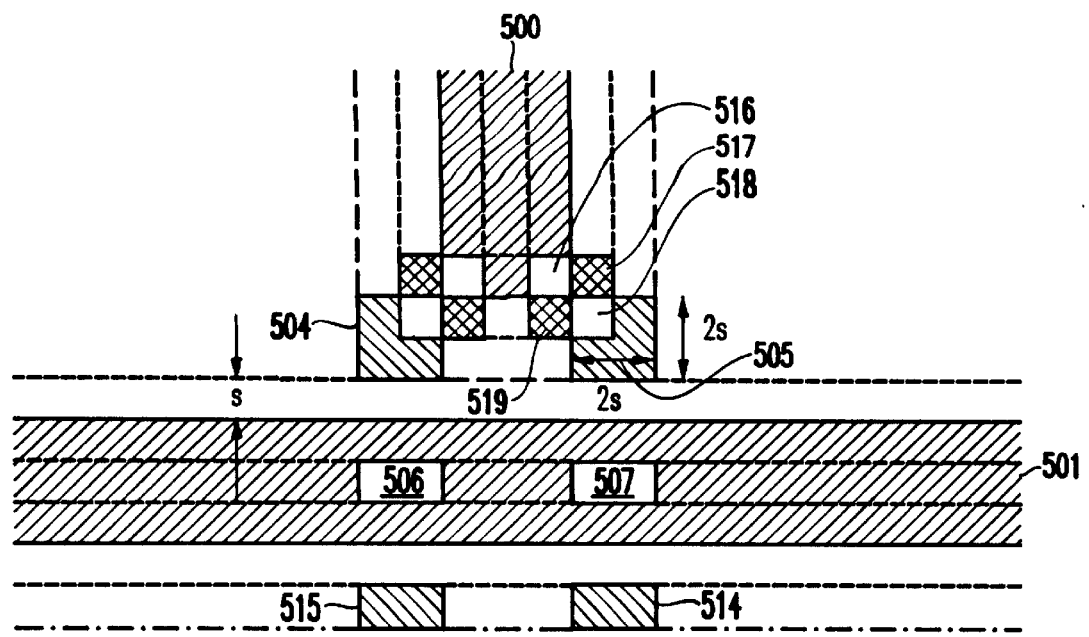
FIG. 5E is a schematic architectural diagram illustrating making the serif itself less likely of being printable by exchanging two pairs of squares in the first layer of corners.

In FIG. 5D, the tenth processing stage is continued. Here the same process is applied to mirroring edge 511, which results in the addition of serifs 515 and 514 to make region 512 mirror region 513. FIG. 5E, shows the eleventh processing stage, where the invention exchanges square serif and part of original mask, each of size s×s, in layer 1 (i.e., inner side band 44 and outer side band 43 shown in FIG. 4), with two unmasked squares, also each of size s×s, in layer 1. More specifically, the invention creates holes 518 in each of the serifs 504, 505. The mirroring-and-reversing process creates quadrants 516–519 around an original corner of wire 500. As discussed above, the diagonal quadrants are made to mirror one another, which creates the pattern shown in FIG. 5E. As discussed above, this exchange process reduces the size of the serifs and prevents them from printing when the mask is ultimately exposed upon a photo resist.

Figure 5F:
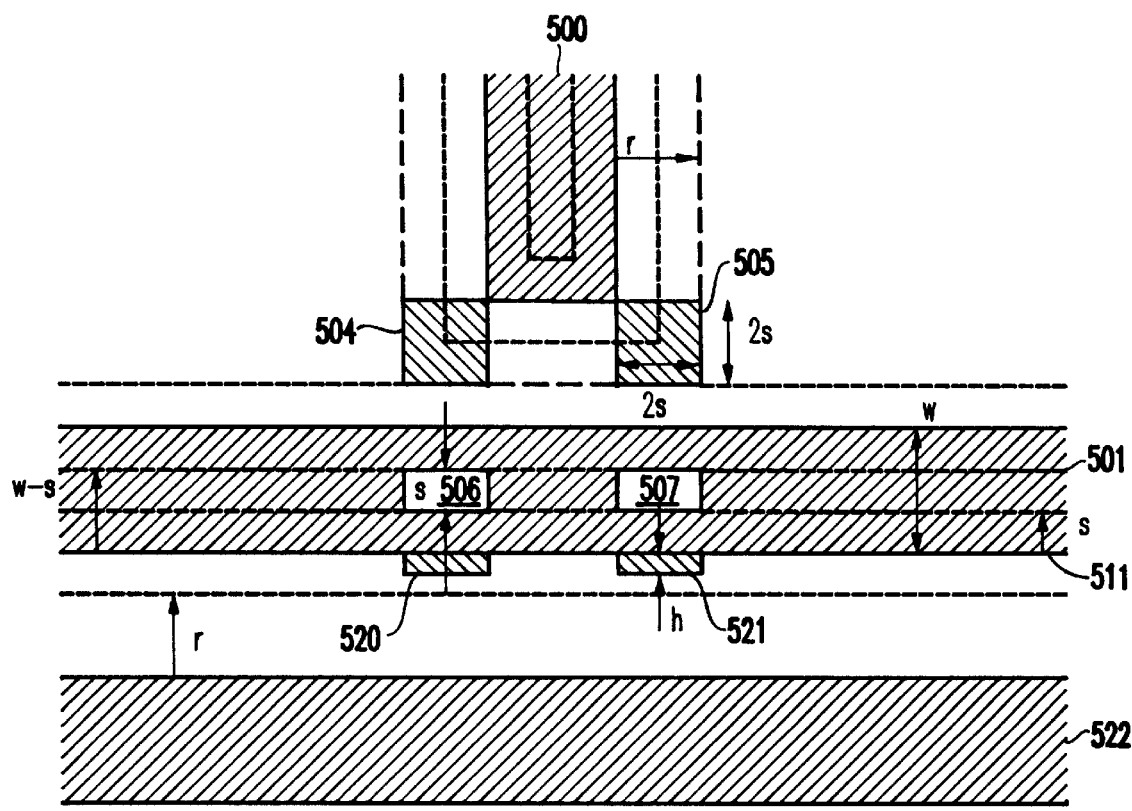
FIG. 5F is a schematic architectural diagram illustrating another method of balancing the mask around the lower edge of the horizontal wire.

FIG. 5F illustrates another embodiment used to balance the mask around the lower edge 511 of the horizontal wire 501 (i.e., another approach for the tenth processing stage). Additional serifs 520, 521 having a height h which is smaller than s are included in this structure. The height h of serifs 520, 521 is smaller than w−2s=s, because: (i) the serifs are closer to the lower edge 511 of the middle horizontal wire 501 than the holes 506, 507 within the middle horizontal wire 501 and (ii) the kernel function K is peaked at its center. The exact size of h depends on the shape of the kernel function K (which is determined/chosen when the invention determines the effective range r and, optionally, the shape of the kernel function K, as discussed above for the first processing stage) and the grid size. If h is less than half of the grid size, then h will be approximated as zero.

"Mirroring-and-reversing" is one of the methods to achieve equal aerial image intensity along the edge of a wire line quickly. But, in the case of many closely spaced wires, the "mirroring-and-reversing" method will propagate the serifs and holes to far-away regions; which is not desirable. Another solution, is to use make of the specific shape of the kernel function K, as described above. This second inventive method finds h, which, in general, will vary if another Kernel function shape is used.

The invention also uses model-based OPC to terminate the propagation of certain assist features (i.e., serifs and holes) to far away regions in a layout. A localization method is used to prevent serif/hole assist features in one place from propagating to far-away regions. More specifically, in FIG. 5F, the height h is determined by the following equation involving the integration of the kernel function [assuming that $K(x, y)=k(x)k(y)$]:

$$\int_{-h}^{0} dy \int_{x_o}^{x_o+2s} K(x, y)\,dx = \int_{s}^{w-s} dy \int_{x_o}^{x_o+2s} K(x, y)\,dx \qquad (1a)$$

Under a simplification embodiment $$K(x,y)=k(x)k(y), \quad (1b)$$

Equation (1a) can be simplified to $$\int_{-h}^{0} k(y)dy = \int_{s}^{w-s} k(y)dy \quad (1c)$$

Alternatively, in terms of an integration function $$G(x) = \int_{-\infty}^{x} k(u)du,$$

Eq. (1c) becomes:

$$G(0)-G(-h)=G(w-s)-G(s) \quad (2)$$

Thus, from the values of s and (w−s), first produced are G(s) and G(w−s), and then G(−h) from Eq. (2). Finally, the value of h is obtained from the value of G(−h) and the curve G(x), and then h is rounded off to a multiple integer of grid size. For example, if h is smaller than half of the grid size, then it is rounded to zero.

Figure 6A:
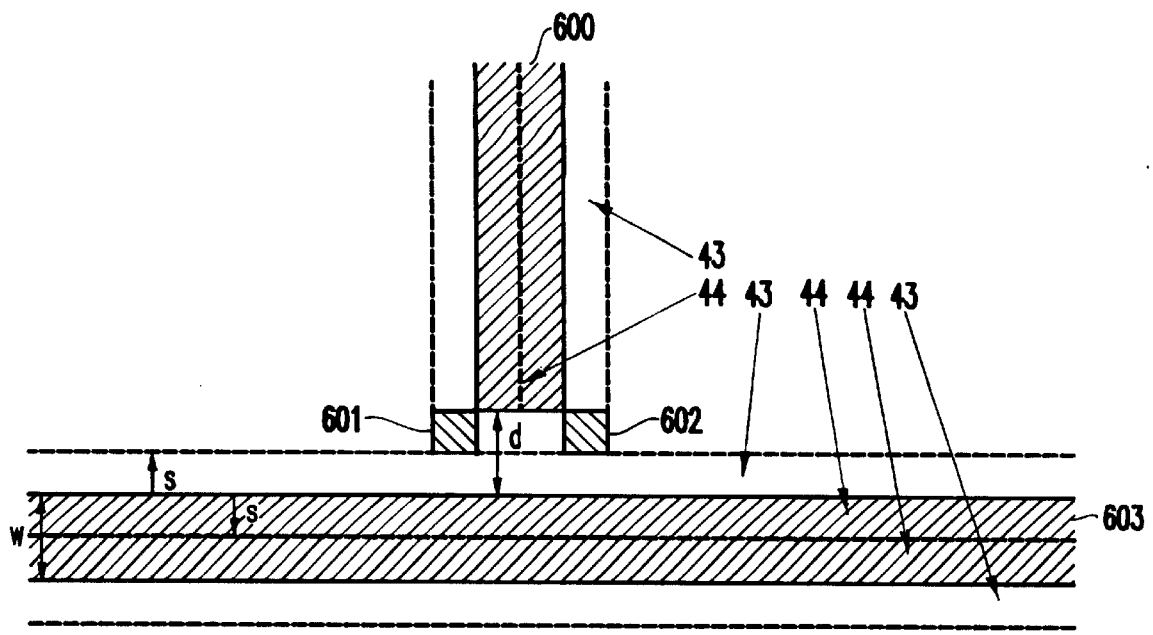
FIG. 6A is a schematic architectural diagram illustrating side band width s equal to half of the wire width w and space d.
Figure 6B:
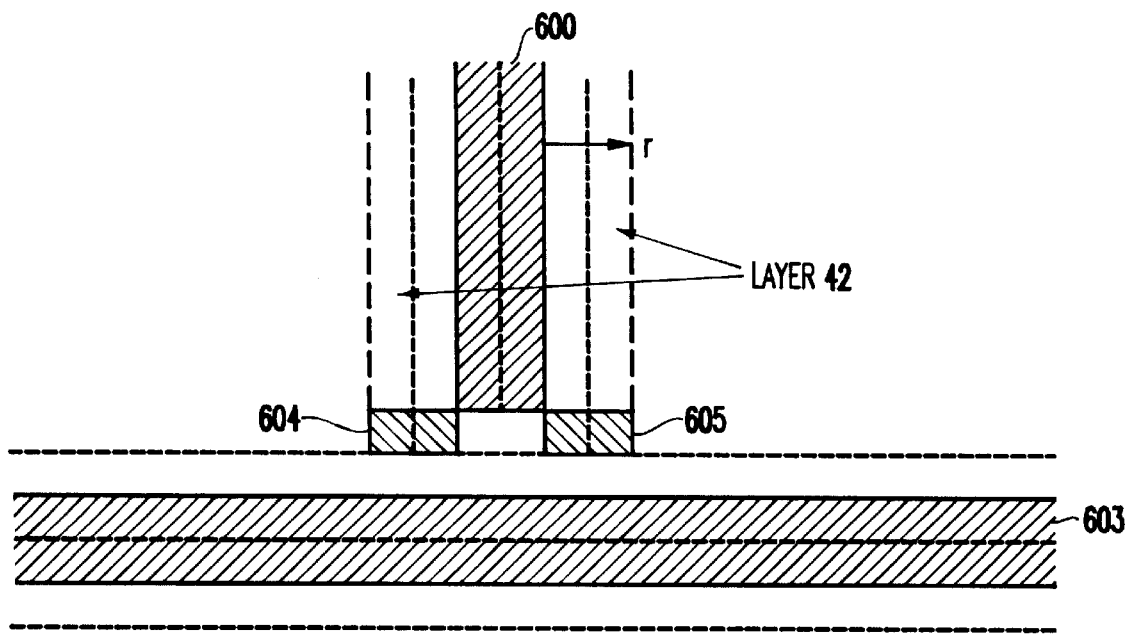
FIG. 6B is a schematic architectural diagram illustrating correcting corner rounding and foreshortening.

FIG. 6A illustrates a first wire 600 adjacent a second wire 603. The first wire includes serifs 601, 602 which is the results of the OPC in the outer and inner side bands 43, 44 (seventh processing stage). FIG. 6B illustrates continued OPC in the outer layer 42 (see FIG. 3), wherein the serifs 601, 602 becomes serifs 604, 605 which are twice as wide. The enlarged parts in serifs 604, 605 are the result of Boolean operation intersection between the outer side band and ideal serif design in the absence of wire 603. This is the results of the ninth processing stage.

Figure 6C:
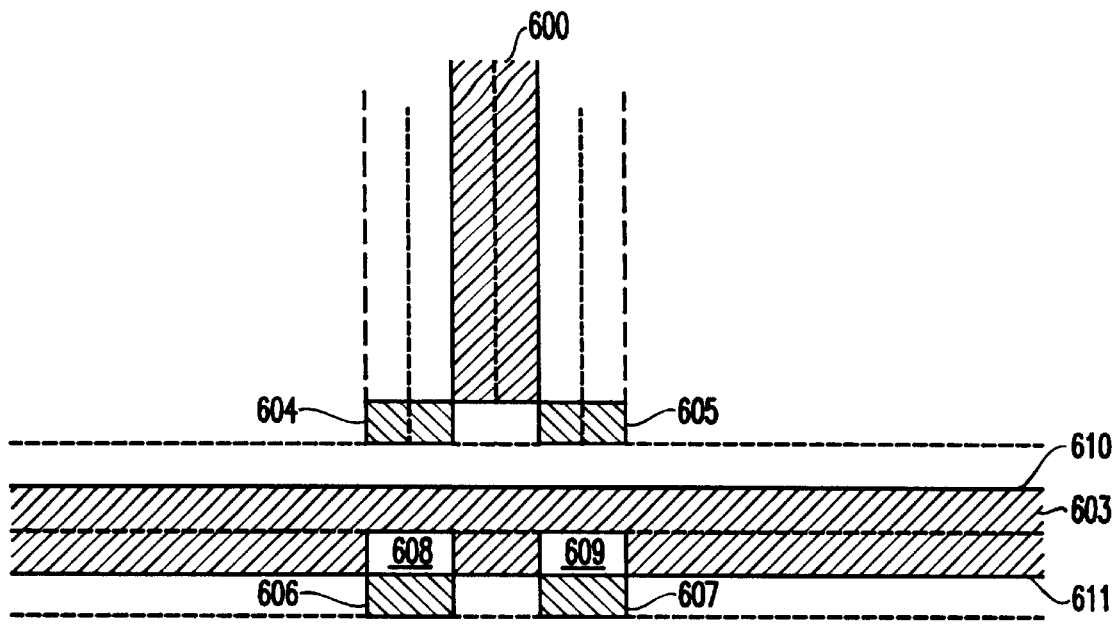
FIG. 6C is a schematic architectural diagram illustrating rebalancing of the lower edge of the horizontal wire.

Then, as with the process shown in FIGS. 5C and 5D, in FIG. 6C, holes 608, 609 and additional serifs 606, 607 are created when forming opposite transparency images adjacent each of the edges 610, 611. These are the results of the tenth processing stage.

Figure 6D:
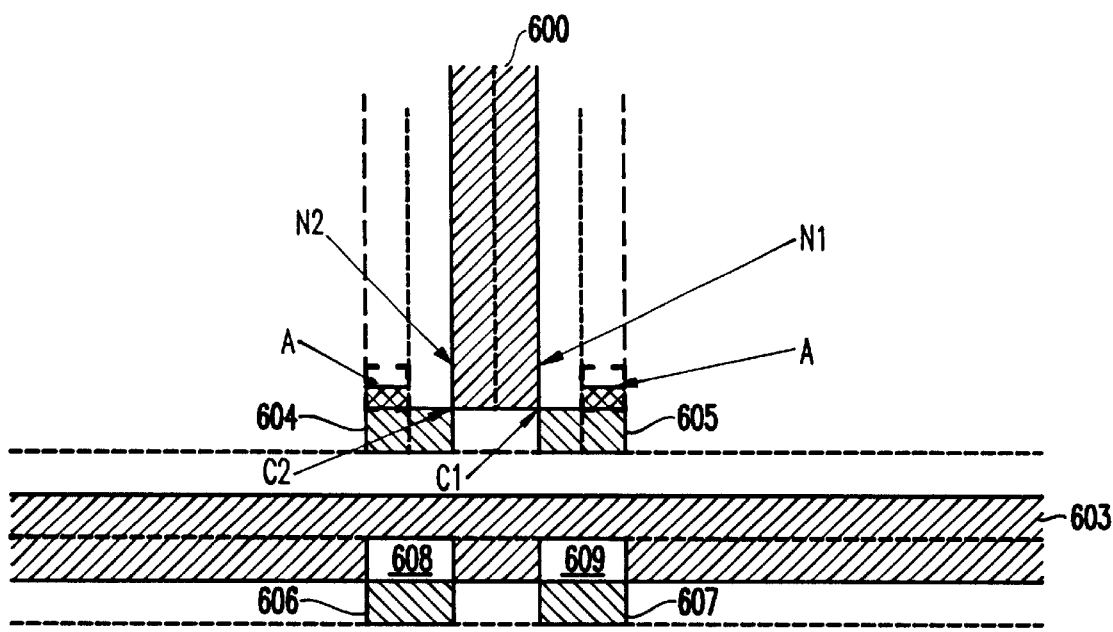
FIG. 6D is a schematic architectural diagram illustrating that filling of the square region A is good for corners C1 and C2, but is not good for edge points N1 and N2.
Figure 6E:
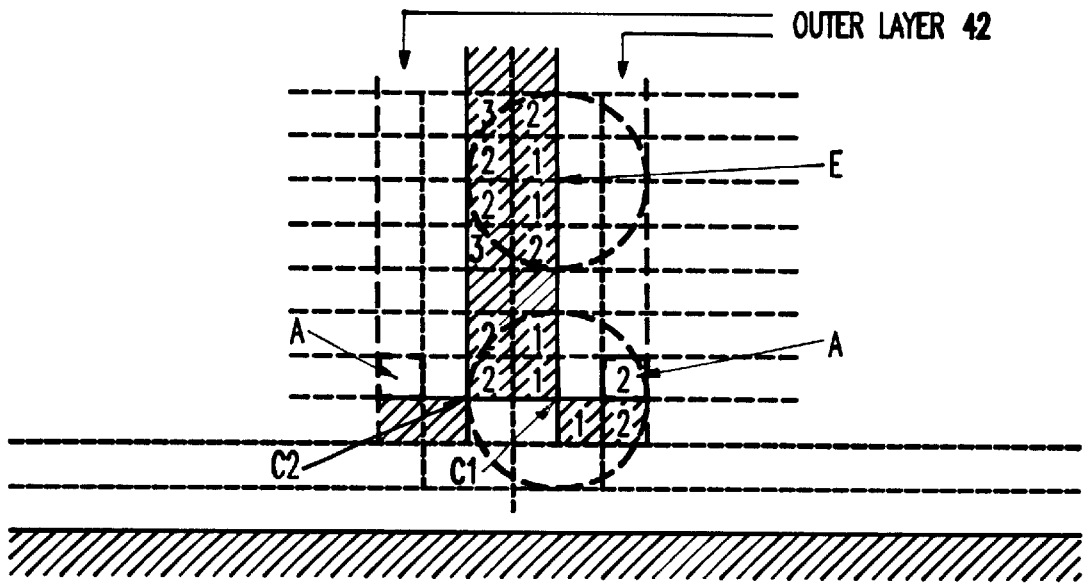
FIG. 6E is a schematic architectural diagram illustrating the filling of small square A making the aerial image intensity at corner C1 closer to that at an edge point E than without filling it.
Figure 6F:
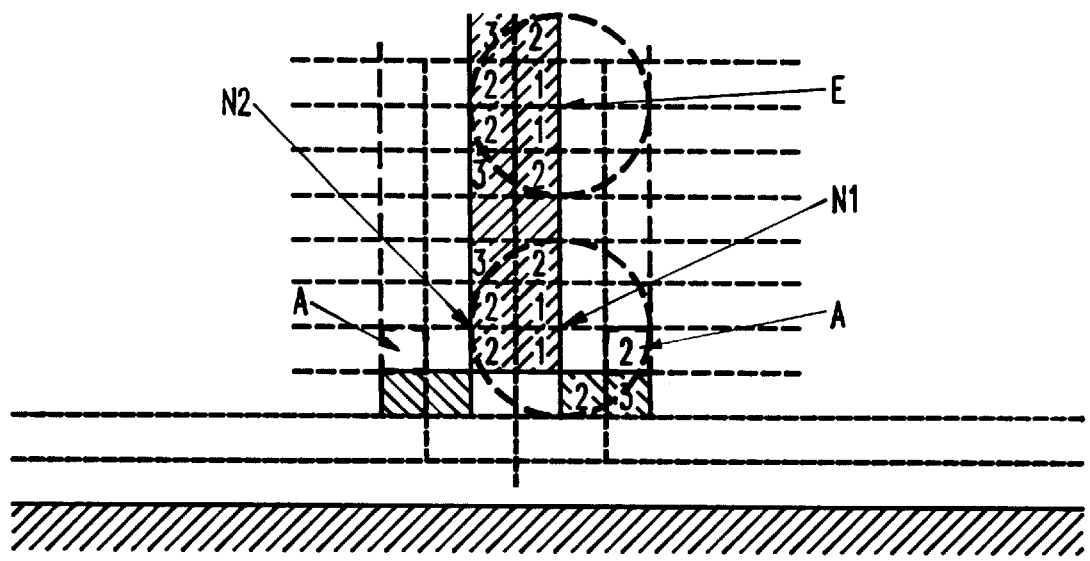
FIG. 6F is a schematic architectural diagram illustrating the filling of small square A making the aerial image intensity at corner N1 different than that at an edge point.

FIG. 6D shows an example of how the invention decides to fill a "pixel" (or a small square) in the domain-balancing process when the eleventh processing stage is carried out. The invention now decides the serif structure in outer layer 42. First, the invention determines whether and/or how two small squares A should be filled or not. For corner C1, the situation is explained in FIG. 6E. For an edge point E, there are two level-1 "pixels", four level-2 "pixels", and two level-3 "pixels." This count of pixels for each group is used as the reference. Filling small square A will increase level-2 pixels from three to four, equal to that for an edge point E. To achieve the desired aerial intensities at corners C1 and C2, the small square A should be filled. On the other hand, filling square A will make the aerial intensities at edge points N1 and N2 too high. This is explained in FIG. 6F. FIG. 6F illustrates that the filling of small square A will make the aerial image intensity at corner N1 different than that at an edge point. On the other hand, leaving the square A unfilled will make the aerial image intensity at corner equal to that at the edge point E. In this instance, as a compromise (i.e., as a balance), the invention fills the lower half the square A (assuming that this is allowed by grid size).

Figure 7A:
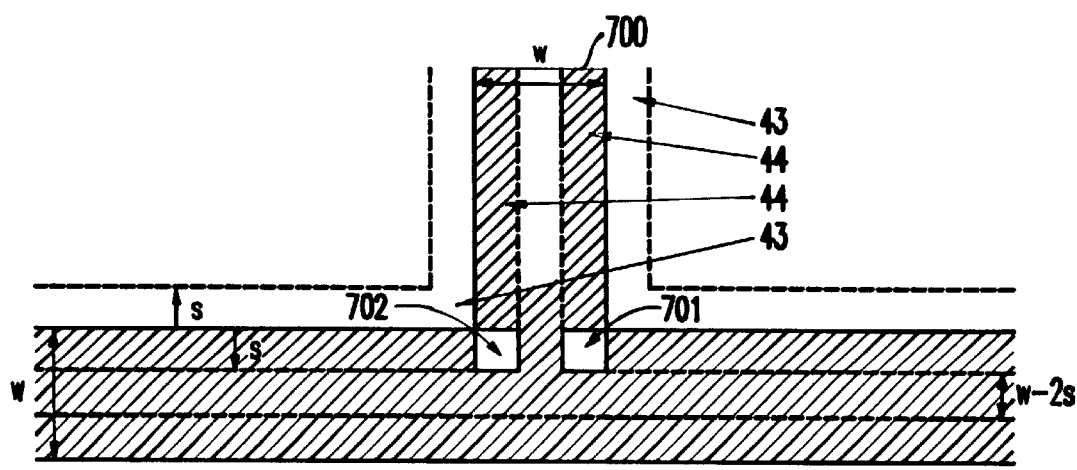
FIG. 7A is a schematic architectural diagram illustrating optical proximity correction for an inverted T-shape wire.
Figure 7B:
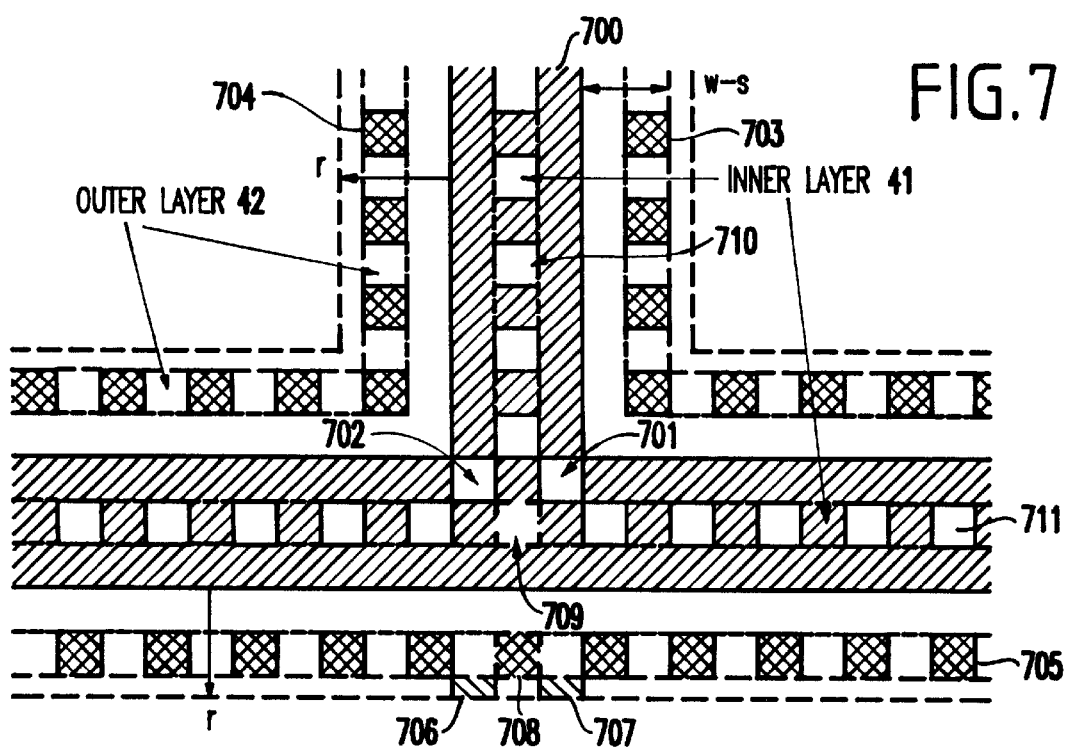
FIG. 7B is a schematic architectural diagram illustrating corresponding optical proximity correction.

FIG. 7A illustrates an inverted "T" shape mask 700 that includes openings 701 and 702 in the inner side band for the OPC after the seventh processing stage, where the side band width s equals ⅓ of the wire width w. FIG. 7B illustrates one embodiment of the OPC serif and hole design after the eleventh processing stage. In FIG. 7B, the same structure shown in FIG. 7A is modified by the invention to include a series of vertical openings 710 and horizontal openings 711. In order to balance these openings, as discussed above, external serifs 703–705 are added. In addition, opening 709 and matching serif 708 help balance the structure. Further, additional serifs 706 and 707 are added. The domain balancing method mentioned above is used to decide the placement of holes 710, 711, and serifs 703, 704. The domain balancing method works in FIG. 7A by accomplishing the OPC in the inner and outer side bands 44, 43 (see FIG. 4). Further, as far as the inner side band 44 and outer side band 43 are concerned, the OPC within them are finished and there should be no additional serifs and holes introduced within the inner side band 44 and outer side band 43 (exchange is an exception). Serifs can only be added in the outer layer 42 (see FIG. 4) and holes can only be introduced in the central band 41 (see FIG. 4).

Figure 7C:
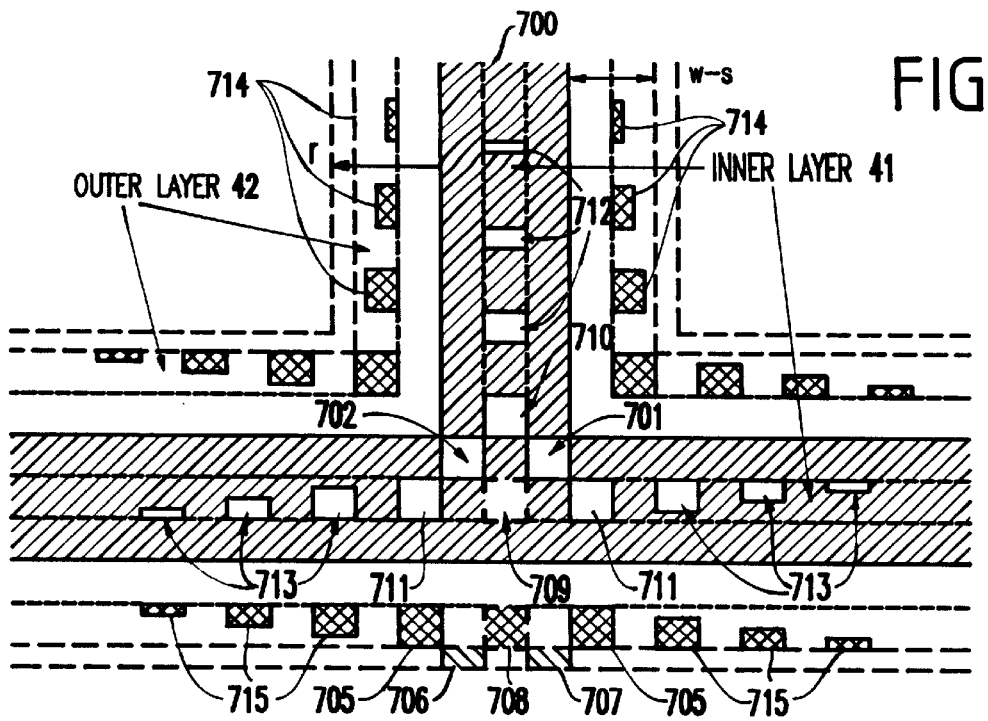
FIG. 7C is a schematic architectural diagram illustrating corresponding optical proximity correction in layer 2.

FIG. 7C illustrates the additional steps that the invention takes to achieve balancing. More specifically, the series of equal holes 710, 711 have been replaced with holes of gradually reduced size, 712, 713 when moving away from the central hole 709. This produces serifs, 714, 715 which also have gradually reduced sizes when moving away from the central hole 709. The holes are reduced one or more grid sizes at a time.

On the left side of hole 709 the openings 713 are reduced in size from the top down. To the contrary, the holes to the right of central whole 709 are reduced in size from the bottom up. These are two different embodiments. The holes 712 proceeding vertically from central hole 709 are reduced from the bottom.

Figure 7D:
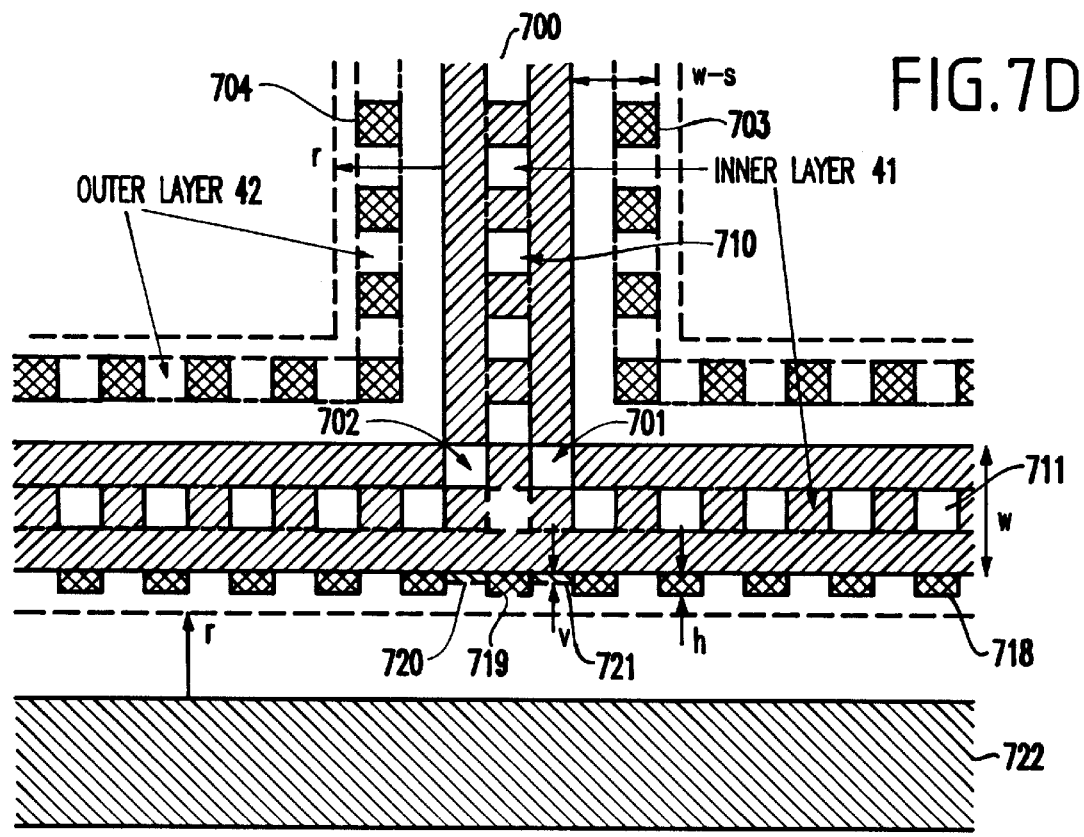
FIG. 7D is a schematic architectural diagram illustrating another method of balancing a mask around the lower edge of the inverted T-shape mask.

FIG. 7D illustrates another balancing method which is different from the simple and fast mirroring-and-reversing method that are used to generate serifs 705–708 in FIG. 7B. In FIG. 7D, the lower serifs 718–721 are moved towards the lower edge of the mask 700 and are also reduced in size to achieve balancing. The exact values of h and v depend upon the shape of the kernel function K and grid size (it is necessary to round off h and v to integer multiples of the grid size). Without detailed calculations, the following relations hold: h<w−2s=s, v<s, and v<h. Quantitatively, v in FIG. 7D is determined by the following equation [under simplification condition (1b)]:

$$\int_{-v}^{0} k(y)dy = \int_{(w-s)}^{w} k(y)dy \quad (3)$$

or its equivalent $$G(0)-G(-v)=G(w)-G(w-s) \quad (4)$$

The variable v is determined by equations of (3) or (4). If v is smaller than half of the grid size, then it will be rounded to zero.

Figure 7E:
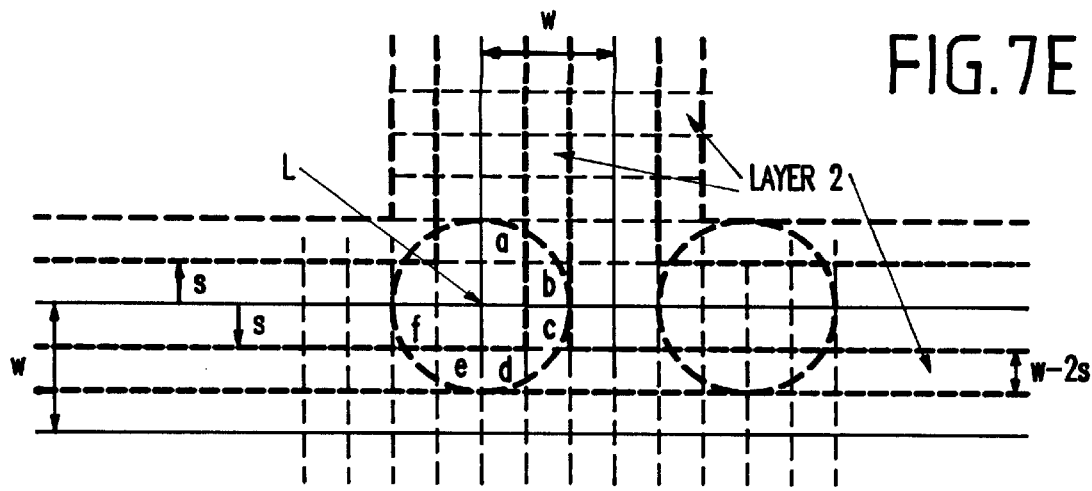
FIG. 7E is a schematic architectural diagram illustrating the OPC in layer 2.
Figure 7F:
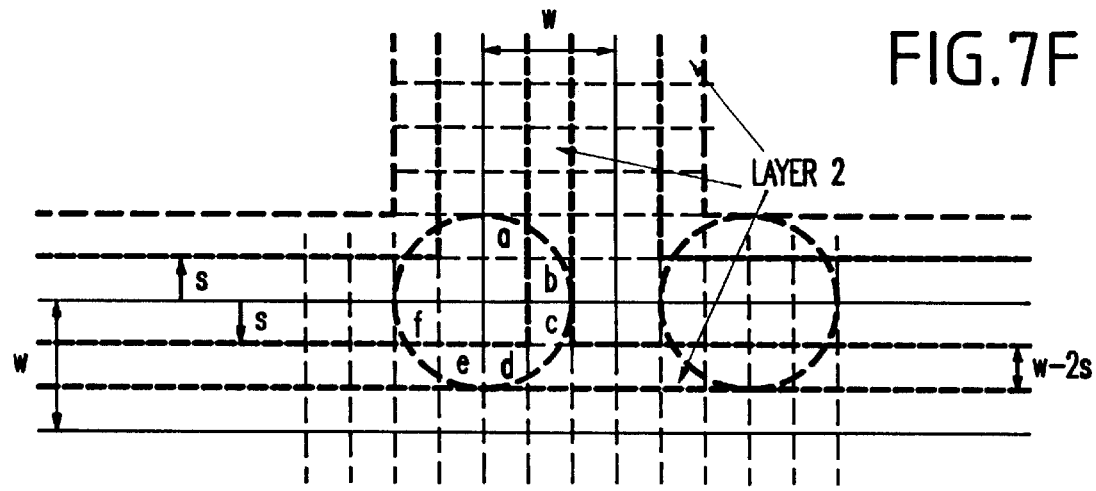
FIG. 7F is a schematic architectural diagram illustrating the OPC in layer 2.

The process of the domain balancing method is started at the inner corner L, as shown in FIG. 7E. There are six level-2 small squares (a, b, c, d, e, and f) which could contribute to the aerial image intensity at the inner corner point L. As a comparison (and as a standard), for an edge point E, there are only four level-2 small squares (see FIG. 7E) which contribute to the aerial image intensity at the edge point E. Further, to achieve a domain balancing around the inner corner L, two of six small squares a, b, c, d, e, and f should become holes. However, small squares a and f are located in the inner side band 44 and cannot become holes. Thus, two holes can only be formed at the locations of small squares b, c, d, and e. Forming a hole at either location c and/or d will make the hole 702 at the inner corner L too big. The small squares c and d are not a good choice. Thus, the invention forms two small holes of size s×s at the locations of the small square b and e, and the results are shown in FIG. 7F. Due to symmetry, another small hole of size s×s has also been formed in FIG. 7F (at the right half of the figure).

Figure 7G:
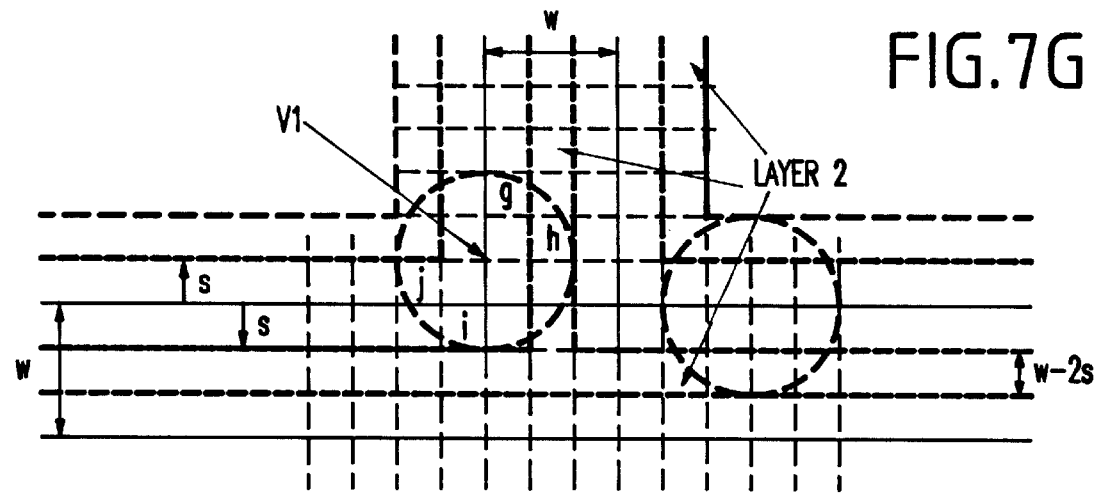
FIG. 7G is a schematic architectural diagram illustrating the OPC in layer 2.

The domain balancing method considers the aerial image intensity at point V1 (see FIG. 7G), whose distance to the inner corner L is s. For the point V1, there are only three level-2 small squares g, h, and i which contributes to the aerial image intensity at point V1. This is one level-2 small square less than the situation for an edge point. The invention needs to add one small square serif of size s×s near point V1 and within outer layer 42. As can be seen in FIG. 7G, there is only one such location at small square j. With the addition of a small square serif j in FIG. 7G, there are now four level-2 small squares which contribute to the aerial image intensity at point V1. Due to symmetry, another square serif of size s×s has also been added in FIG. 7G (at the right half of the figure).

Figure 7H:
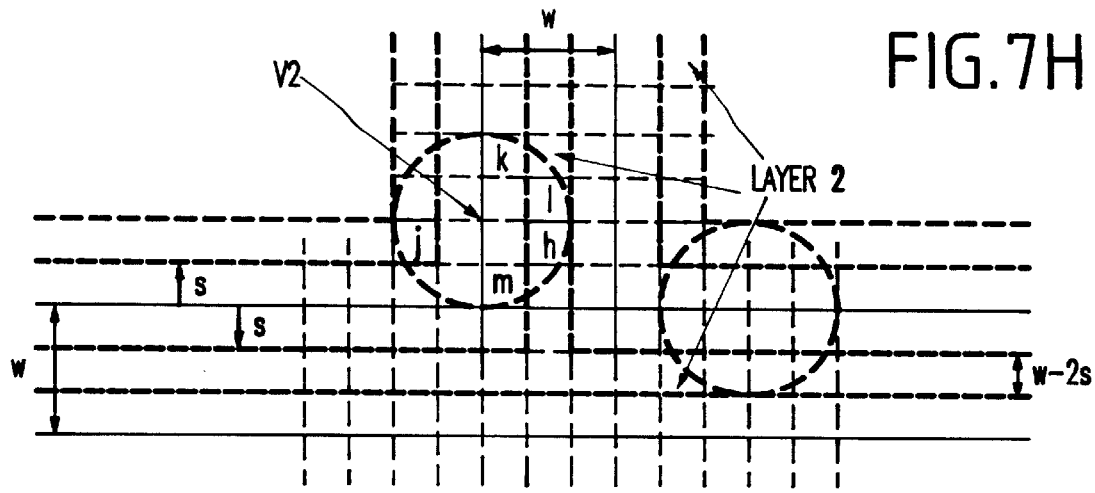
FIG. 7H is a schematic architectural diagram illustrating the OPC in layer 2.
Figure 7I:
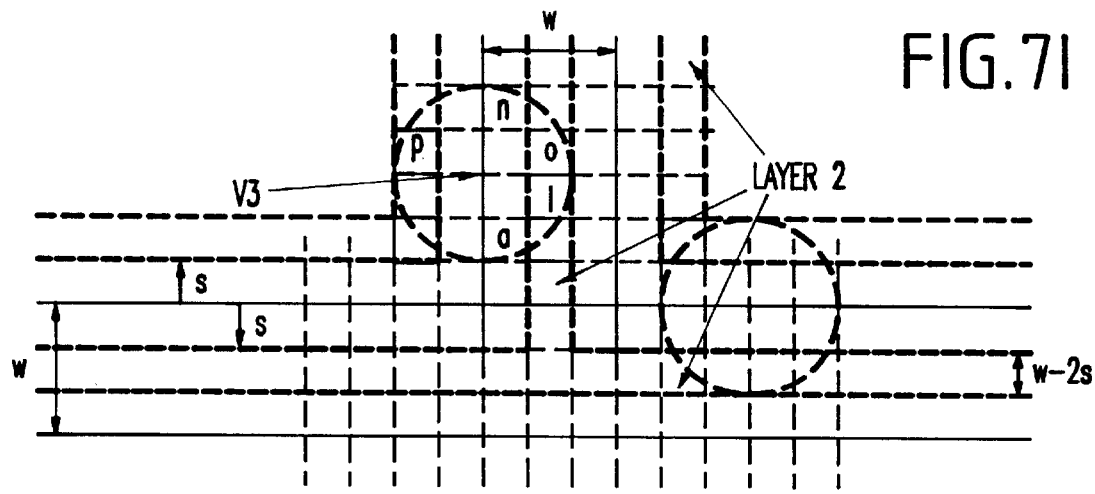
FIG. 7I is a schematic architectural diagram illustrating the OPC in layer 2.
Figure 7J:
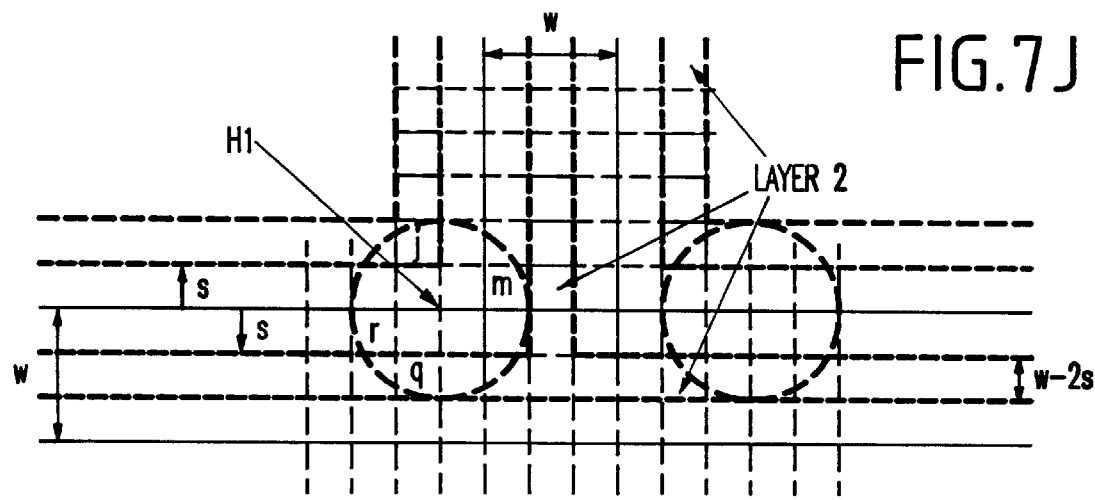
FIG. 7J is a schematic architectural diagram illustrating the OPC in layer 2.

After point V1, the invention considers the aerial image intensity at the next selected edge point, which is point V2 shown in FIG. 7H. The distance between V2 and V1 is s. Initially, there are five level-2 small squares k, l, h, m, j for point V2. One of them should change its transparency. However, the transparency at small squares k, m, and j has been previously fixed. This leaves two small squares l and h as only candidates. Changing the small square h to a hole would make a large hole, which is not desirable. Thus, the invention decides to turn small square l to become a square hole of size s×s. After such a transparency change, there are now four level-2 small squares, k, h, m, and j which contributes the aerial image intensity at the edge point V2 (see FIG. 7H).

Next, the invention decides how to accomplish domain balancing for horizontal edge points whose distances to the inner corner point L are integer times of s. The first such point is point H1 shown in FIG. 7J. There are four level-2 small squares j, m, q, and r that contributes to the aerial image intensity at the edge point H1. The domain balancing is good for the edge point H1.

Figure 7K:
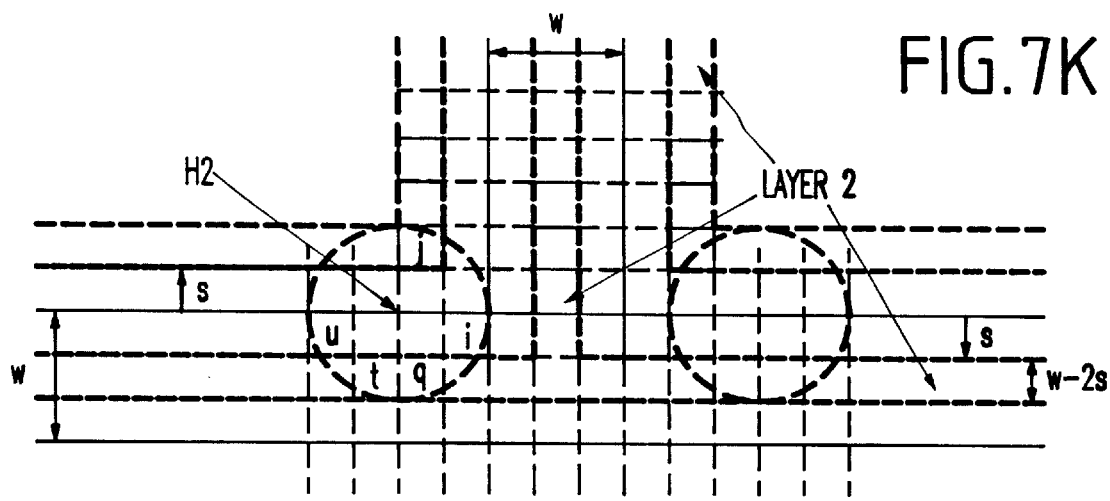
FIG. 7K is a schematic architectural diagram illustrating the OPC in layer 2.

The invention moves its attention to the next horizontal edge point H2 (see FIG. 7K). Initially, there are five level-2 small squares j, i, q, t, and u. The invention needs to change the transparency of one of them. However, the transparency of small squares q and t as the only candidates for the change of transparency, (i.e., to become a hole, since each of them is in the middle of the wire). Turning the small square q into a square hole would form a large hole, since the small square q is already adjacent to a small square hole. Thus, the only good choice is the small square t. After creating a small square hole of size s×s at location t, the invention achieves the domain balancing for the edge point H2 for level-2 small squares. Due to symmetry, a similar square hole of size s×s has also been created in FIG. 7K (at the right half of the figure).

Figure 7L:
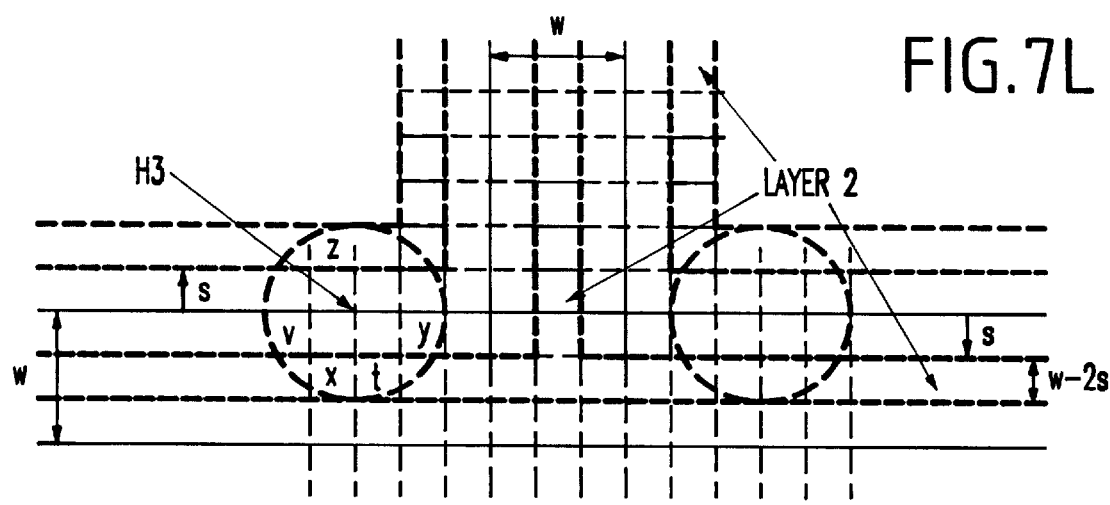
FIG. 7L is a schematic architectural diagram illustrating the OPC in layer 2.

After the edge point H2, the invention does the OPC for the edge point H3 (see FIG. 7L). Initially, there are only three level-2 small squares y, x, and v for point H3. One small square serif of size s×s is needed in the outer layer 42. There are two such locations. Only the location z is a good one. Creating a square serif at the other location would make a large serif, which is not desirable. With the addition of square serif z in FIG. 7L, there are now four level-2 small squares to point H3. Due to symmetry, a similar square serif of size s×s has also been created in FIG. 7L (at the right half of the figure).

Figure 7M:
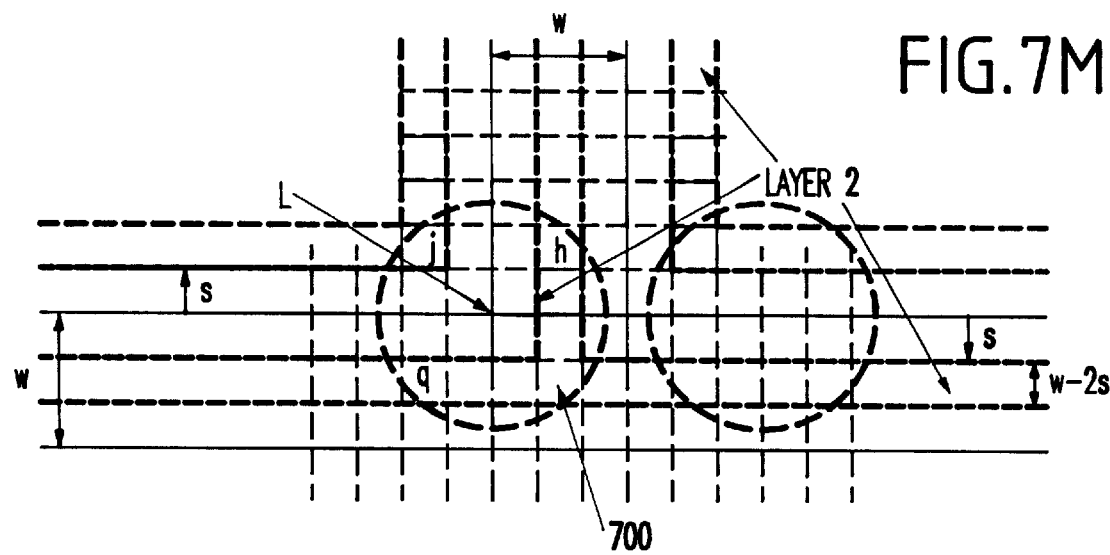
FIG. 7M is a schematic architectural diagram illustrating the OPC in layer 2.

FIG. 7M shows how the hole 709 in FIG. 7B is created. The square hole 709 is created by considering level-3 small square to the inner corner L. For a typical edge point, there are two level-3 small squares that contributes to the aerial image intensity at the edge point (see FIG. 1). Initially, there are four level-3 small squares h, 709, q, and j for the inner corner point L. The transparency of small squares h, q, and j have been determined previously and can not be changed. Changing the transparency of 709 will move the aerial image intensity at the inner corner L close to that of an edge point. If the addition of hole 709 leads to too small aerial image intensity for any point within the inverted T shape mask, then it should not be added. This is the task of the twelfth processing stage, as mentioned above.

After accomplishing OPC at the point V2, the invention moves to the next edge point of V3, whose distance to V2 is s (see FIG. 7L). Initially, there are only three level-2 small squares n, o, and a that make contribution to the aerial image intensity at point V3. Thus, the invention needs to add one more small square serif of size s×s in the outer layer 42. There are only two such locations. The position p is chosen, since it will not connect to the nearby serif j to form a larger serif. After a small square serif of size s×s is added at the location j, there are now four level-2 small squares that make contribution to the aerial image intensity at the edge point V3. Again, due to symmetry, another square serif of size s×s has also been added in FIG. 7L (at the right half of the figure).

Repeat the above steps for edge points whose distances to the inner corner L are integer times of s, the invention obtains the holes 710 and serifs 703, 704, shown in FIG. 7B.

A slightly relaxed domain balancing method is used to decide the placement of holes 712, 713 and serifs 714. Turning now to how in detail the domain balancing method leads to the final serif and hole design patterns (as shown in FIG. 7C, above).

Figure 7N:
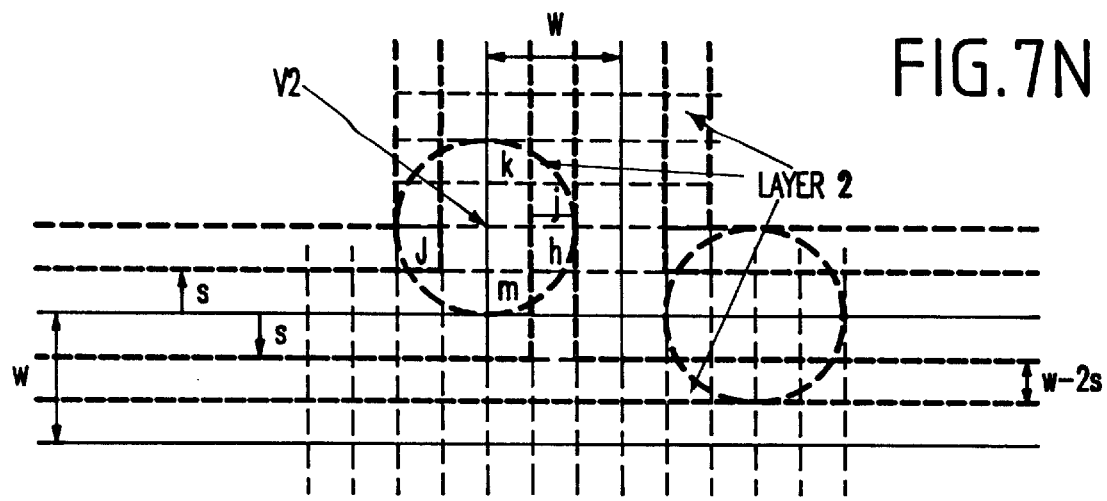
FIG. 7N is a schematic architectural diagram illustrating the OPC in layer 2.

One embodiment of the invention starts to reduce serif and hole size at the edge point V2 (see FIG. 7N). The invention considers the aerial image intensity at V2. This is the same as in FIG. 7H, the transparency of one of five small squares k, l, h, m, and j should be reversed, and the small square l is decided as a better candidate than the small square h. The transparency of the rest three small squares k, m, and j have already been fixed. But, different from FIG. 7H, just part of small square l is changed to a hole to gradually reduce hole and serif sizes. In FIG. 7N, the hole width is still s, but its height is reduced from s in FIG. 7H to a value less than s. As limited by grid size, the height of the hole must be multiple integer of the grid size. Namely, the reduction proceeds at one or more grid size a time. Notice that the hole at l could also take a form of height s and width being less than s. Now, the aerial image intensity at the edge point V2 is only approximately balanced. This is a compromise between achieving a fairly good domain balancing and reducing serif/hole size fairly fast.

Figure 7O:
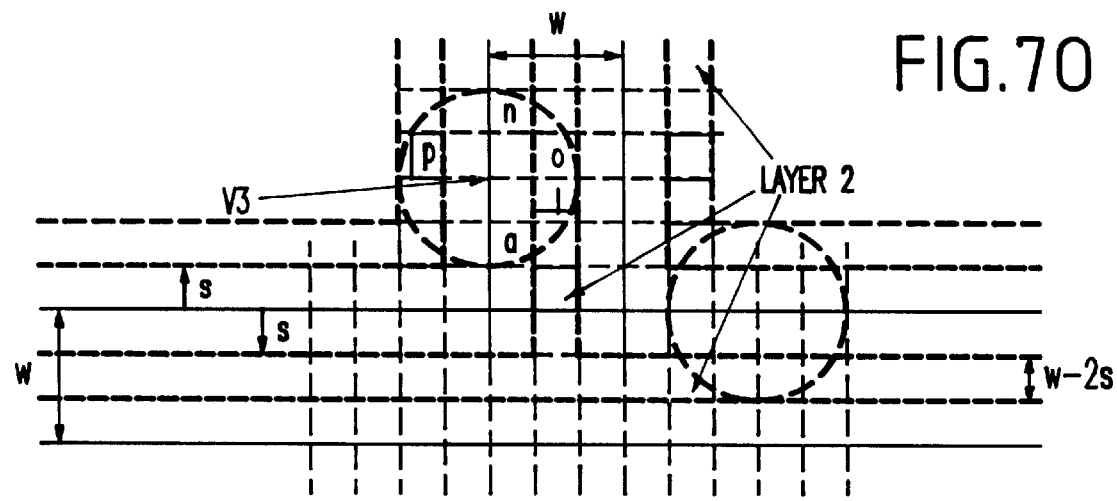
FIG. 7O is a schematic architectural diagram illustrating the OPC in layer 2.
Figure 7P:
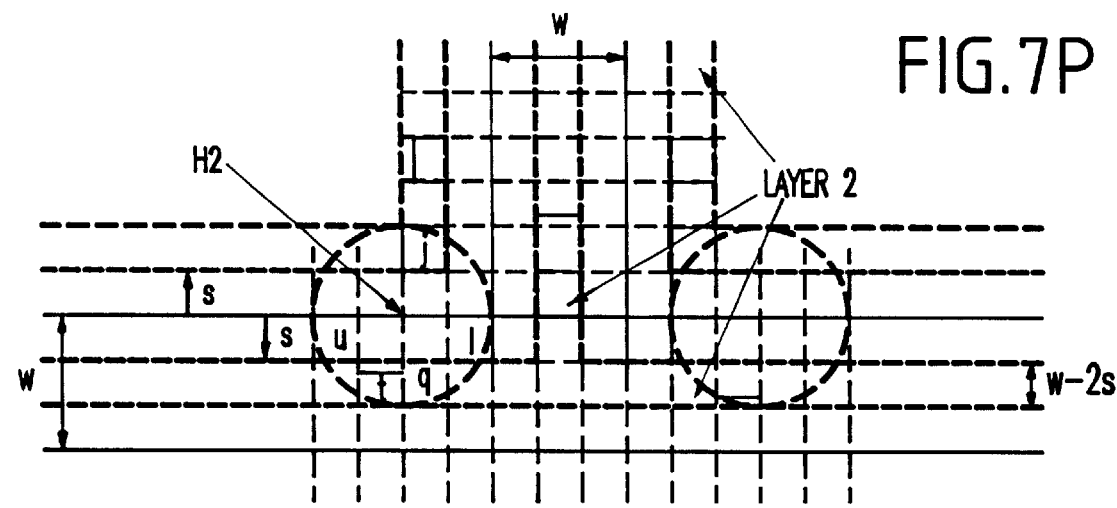
FIG. 7P is a schematic architectural diagram illustrating the OPC in layer 2.

After domain balancing approximately at the point V2, the invention moves to the next edge point V3, whose distance to V2 is s (see FIG. 7O). As in FIG. 7I, a serif should be added at location p to achieve domain balancing at point V3. But, different from FIG. 7I, the serif at location p is not a square. FIG. 7O shows one embodiment of a rectangular serif at location p that has the same area as the hole at the location l. This embodiment is a better choice should there be another mask shape at the upper left corner of FIG. 7O. The serif at location p can also take other form and shape, such as a rectangle of width s and same height as the hole at the location l. Under the given accuracy on aerial image intensity assumed here (i.e., all points within a level-2 small square contributes same amount to the aerial image intensity), various embodiments of the serif at the location p all lead to an exactly balanced level-2 contribution for the edge point V3, as long as the serif at the location p has the same area as the hole at the location l. When implemented in an OPC software for an IC circuit, various more elaborate evaluation schemes (for example, the contribution from a point within a level-2 small square depends on its distance to the center of the circle), can be used to achieve an optimal choice on the location, size and shape of the serif at location p (as well as the hole at location l). In a similar way, the size of a hole at location t (see FIG. 7K) can also be reduced. FIG. 7P shows one embodiment at the left half of the figure and shows another embodiment at the right half of the figure.

Figure 7Q:
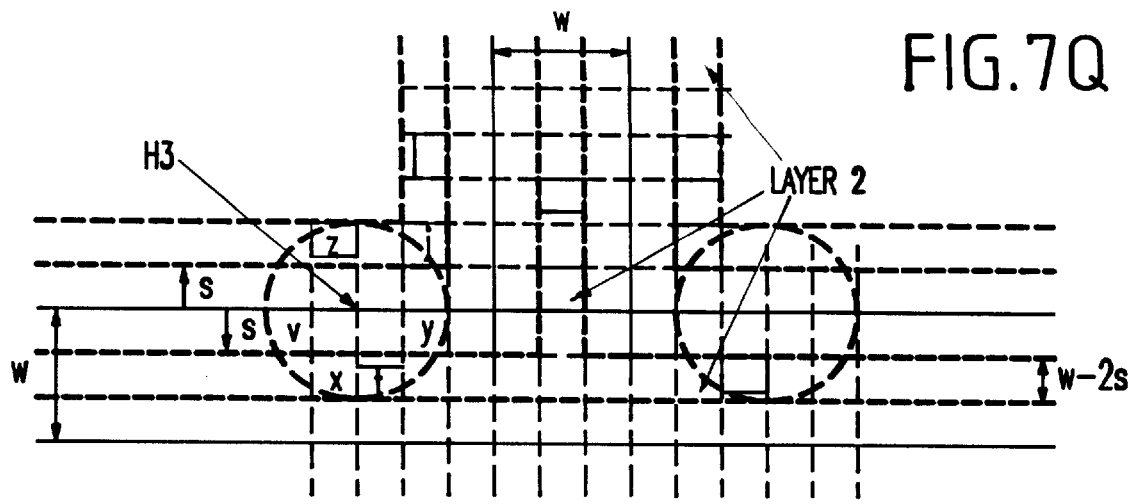
FIG. 7Q is a schematic architectural diagram illustrating the OPC in layer 2.

At edge point H2 in FIG. 7P, the level-2 domain balancing is achieved approximately for the aerial image intensity at H2. After finishing the OPC around point H2, the invention moves to the next horizontal point H3 (see FIG. 7Q). Similar to FIG. 7L, a serif is needed at location z. However, different from FIG. 7L, the size of the serif should now be less than s×s. FIG. 7Q illustrate one embodiment of a serif at location z, where the serif area at location z is the same as the size of the hole at location t. With the addition of the serif at z, the invention achieves exact level-2 balancing for the edge point H3. This is true even for a more elaborate evaluation in which the contribution from a point within a level-2 small square depends on its distance to the center of the circle.

Figure 8A:
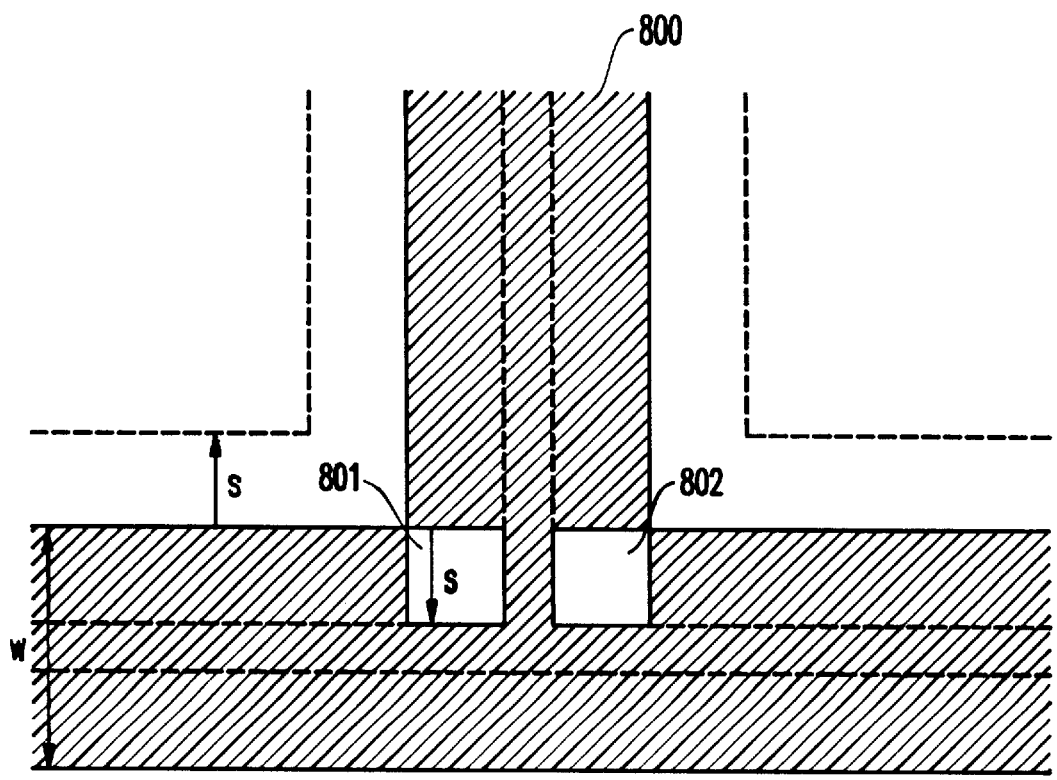
FIG. 8A is a schematic architectural diagram illustrating optical proximity correction for the (inverted) T-shape wire shown in FIG. 7A.
Figure 8B:
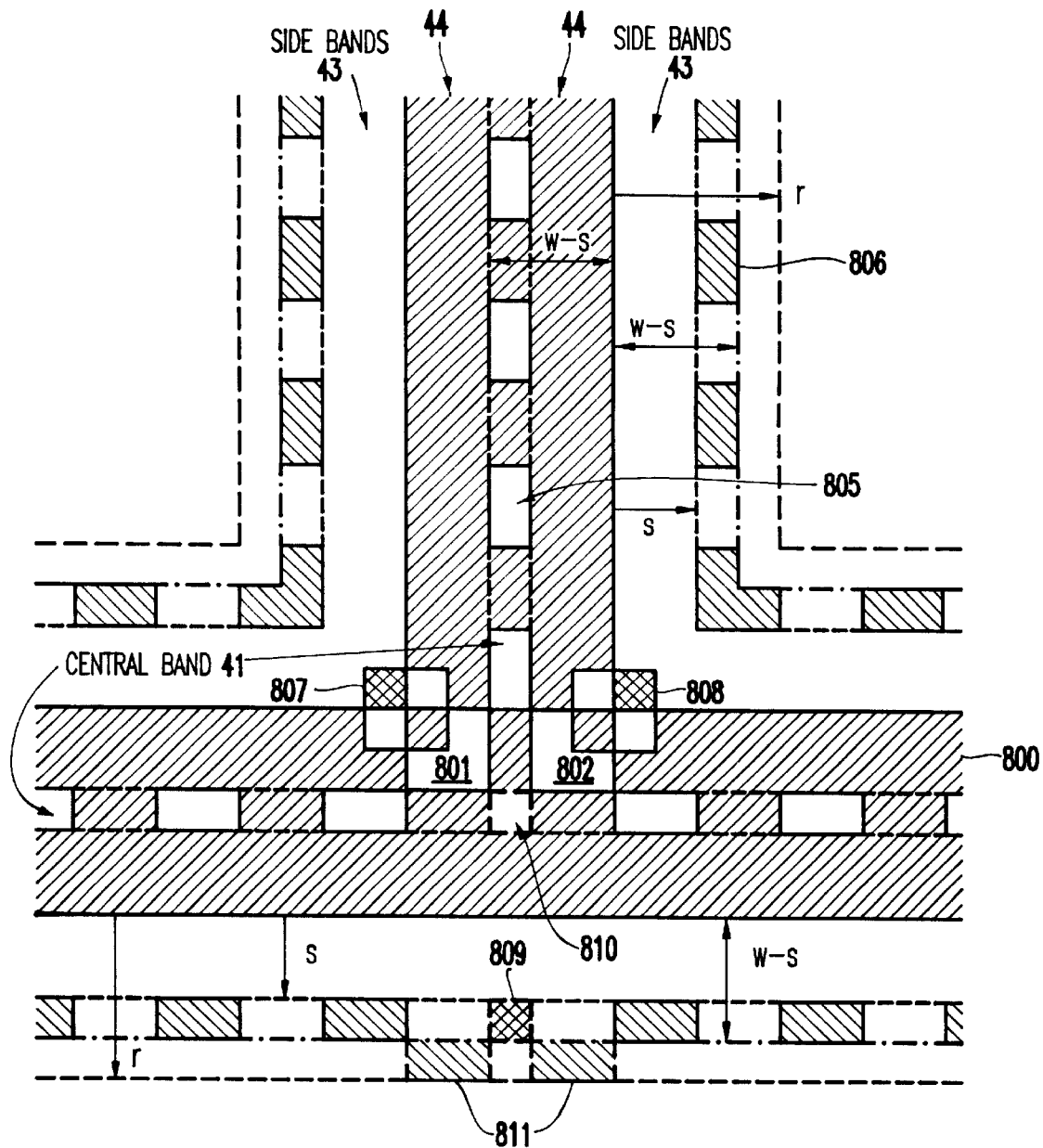
FIG. 8B is a schematic architectural diagram illustrating the initial choice in FIG. 8A leads to a final optical proximity correction design.

FIG. 8A illustrates basic optical proximity correction holes 801, 802 in an inverted T-shaped 800 mask having side band widths s equal to ⅖ of the wire width w. FIG. 8A is the result of the seventh processing stage, in which the OPC has been performed in both the inner and outer side bands. FIG. 8B illustrates a final mask design, starting from the initial structure shown in FIG. 8A. More specifically, in FIG. 8B a series of openings 805 occurs along the central band 41 of the structure 800. The openings 805 are rectangular in shape. As discussed previously, the reversing process along each edge of the structure 800 produces the external rectangular serifs 806. Further, the invention performs an exchange of the diagonal quadrants surrounding the corners which removes portions of the holes 801, 802 and creates serifs 807, 808. Further, the invention includes a central hole 810 and a corresponding serif 809 as well as serifs 811 which are formed as discussed above. For an inverted T shape mask, FIGS. 7B and 8B illustrates two embodiments of serif and ? hole designs for the OPC.

Figure 8C:
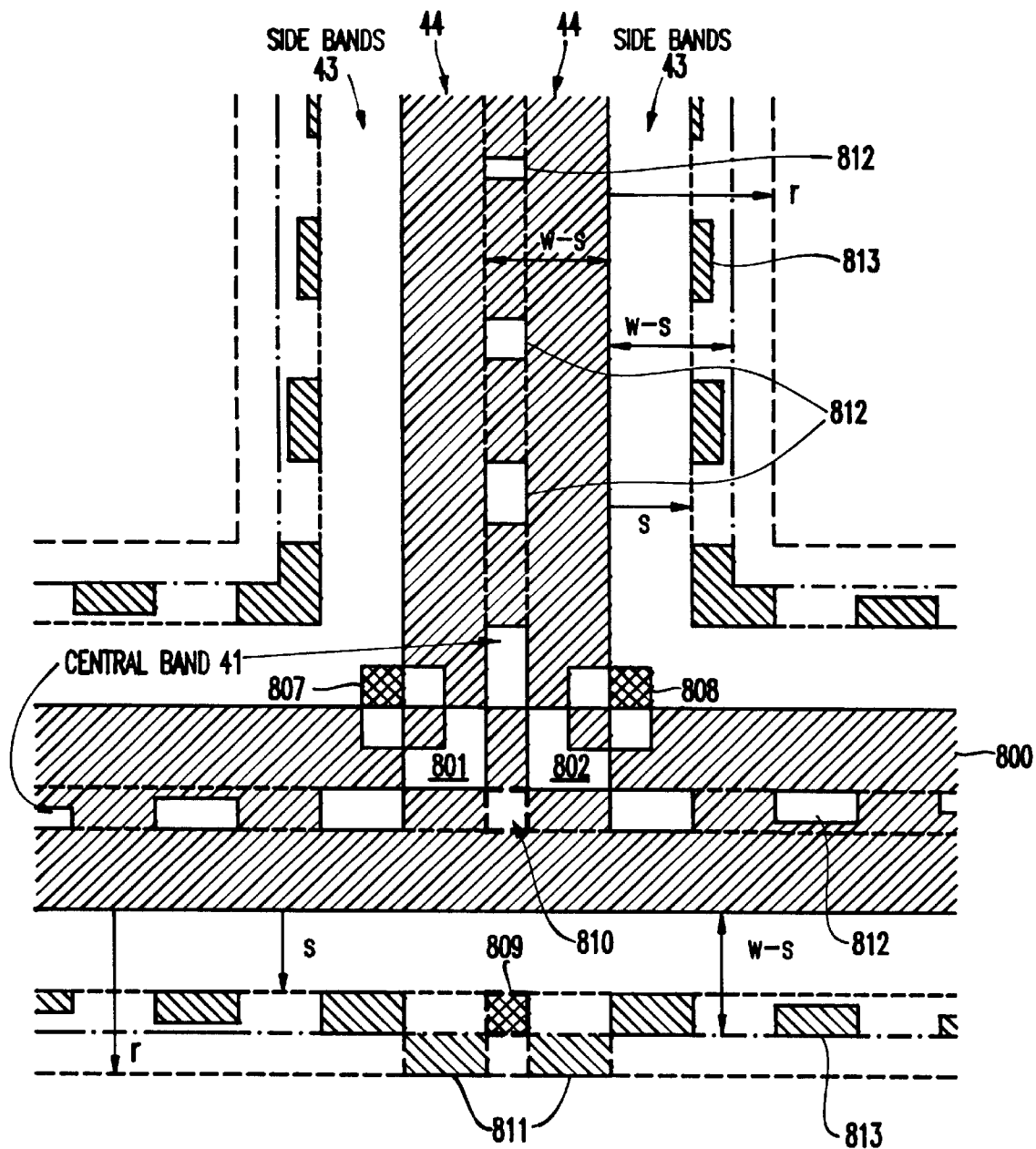
FIG. 8C is a schematic architectural diagram illustrating the initial choice in FIG. 8A leads to another final optical proximity correction design.

FIG. 8C is similar to FIG. 8B except (as discussed above with respect to FIG. 7C) the openings 812 are gradually reduced in size as their distance increases from the central opening 810. In a similar manner to that discussed above, the serifs 813 have a corresponding reduction in size which is different for the left and right side. In this embodiment, the serifs and holes do not propagate to far away regions, as the case in FIG. 7C.

Figure 8D:
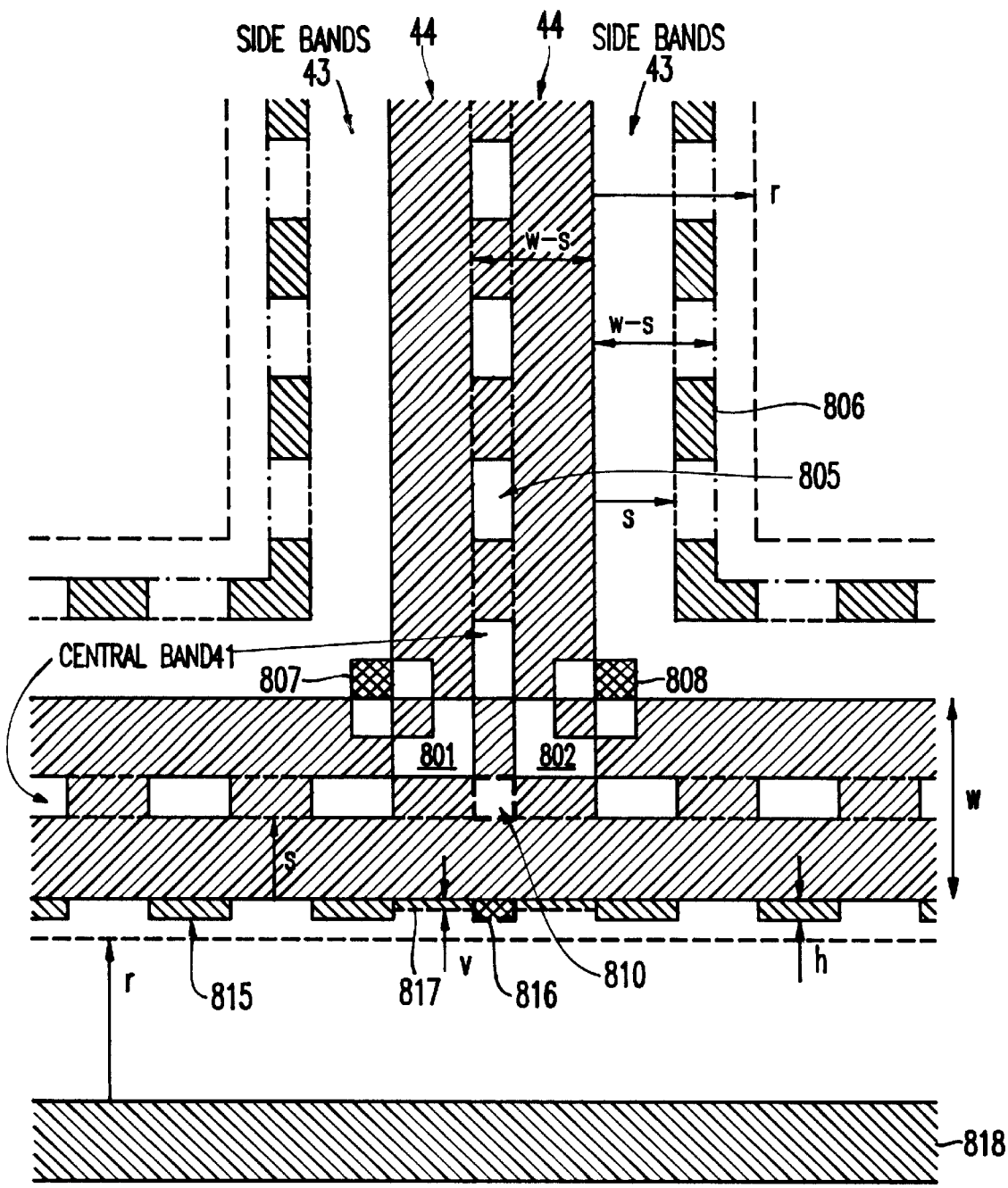
FIG. 8D is a schematic architectural diagram illustrating another embodiment of balancing the mask around the lower edge of the inverted T-shape mask.

FIG. 8D is a another variant of the balancing process shown in FIG. 8B. As discussed with respect to FIG. 7D above, with the additional adjacent shape 818, the lower serifs 815–817 are moved to connect with the lower edge of the inverted T shape mask and are also reduced in size. The calculations regarding the size reduction of h and v the serifs 815–817 are similar to that discussed above with respect to FIG. 7D.

Figure 9A:
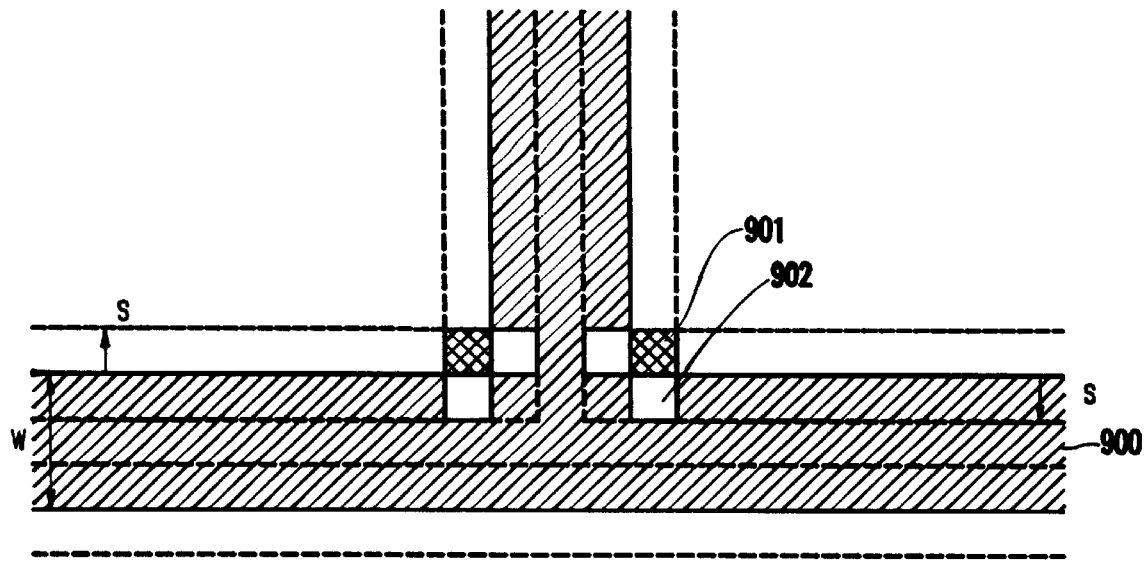
FIG. 9A is a schematic architectural diagram illustrating the same side band width as in FIG. 7A, but with a different serif/hole layout in the inner and outer side bands.
Figure 9B:
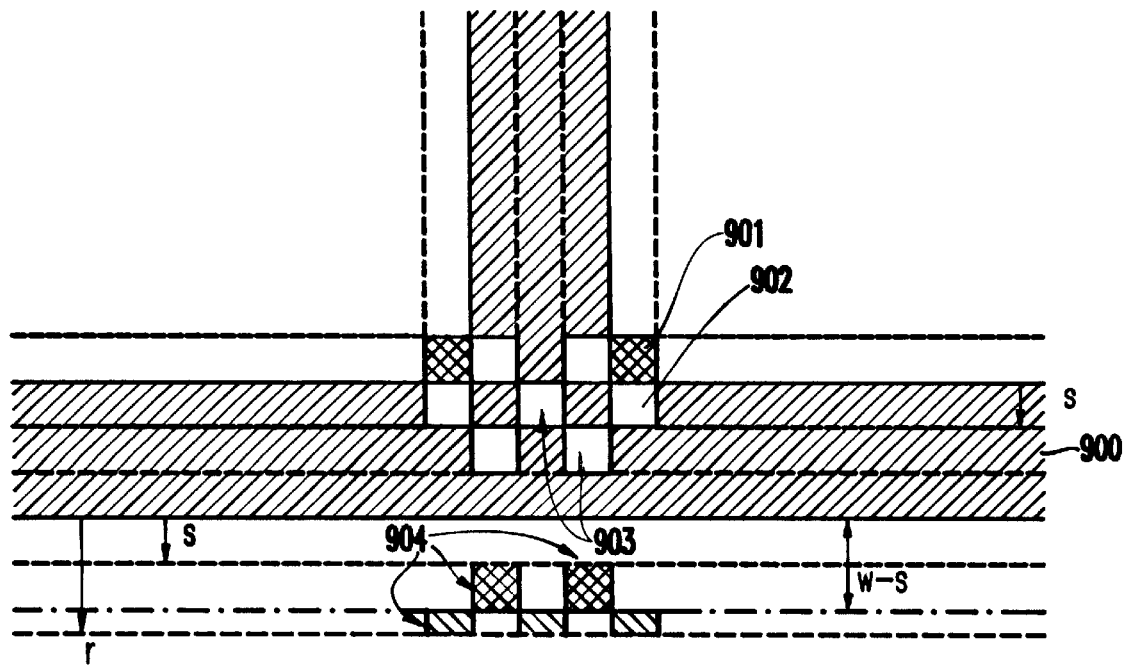
FIG. 9B is a schematic architectural diagram illustrating that the choice in FIG. 9A leads to this simpler final serif mask design.

FIG. 9A illustrates an inverted T-shaped mask 900 wherein each interior quarter includes four quadrants (e.g., 901, 902) where the diagonal quadrants are mirror images of one another, as discussed above. Comparing FIG. 9A with FIG. 7A, FIG. 9A shows another initial choice of OPC in the side band, which is counter-intuitive but still being good. FIG. 9B shows the final mask after initial choice shown in FIG. 9A. FIG. 9B includes a series of additional holes in 903 and additional matching serifs 904. The additional holes 903 are determined by the domain balancing method, as explained in FIG. 9D.

Figure 9C:
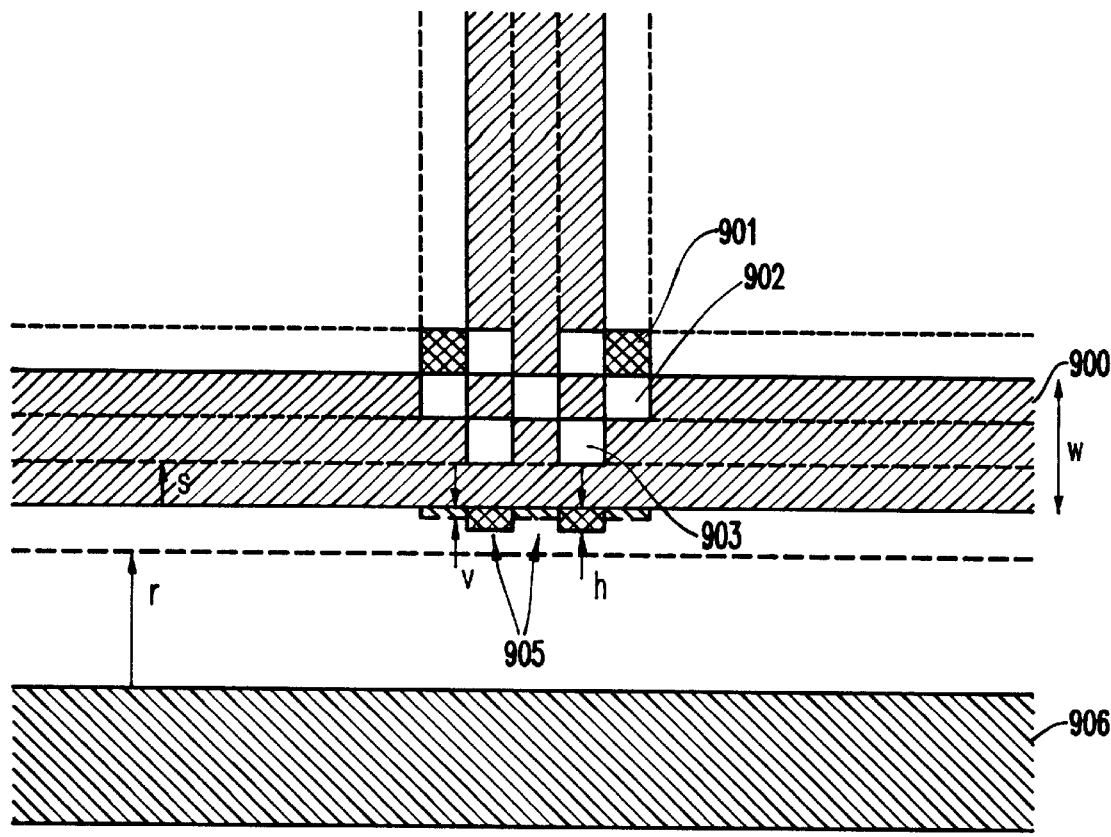
FIG. 9C is a schematic architectural diagram illustrating another method of balancing the mask around the lower edge of inverted T-shape mask.

FIG. 9C illustrates the same methodology discussed above with respect to FIGS. 7D and 8D. More specifically, FIG. 9C includes an additional mask feature 906. Therefore, as discussed above, the serifs 905 are moved towards the lower edge of the inverted T shape mask and are also reduced in size. More specifically, the foregoing sizes h and v are determined using equations 1–4, as discussed above.

Figure 9D:
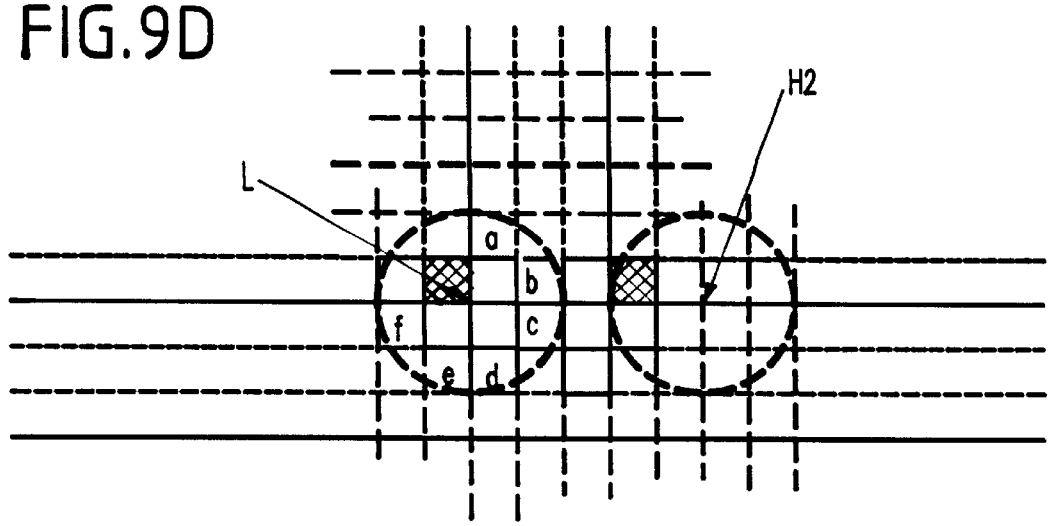
FIG. 9D is a schematic architectural diagram illustrating the OPC in layer 2.

Similarly to FIG. 7E–7Q, the domain balancing method decides the placement of hole 903. It can be shown in detail how the domain balancing method works starting from the initial choice made in FIG. 9A. FIG. 9A accomplish the OPC in the inner and outer side bands 44, 43 (see FIG. 4). In other words, level-1 domain balancing has been achieved for each and every edge points, and there should be no additional serifs and holes introduced within the inner side band 44 and outer side band 43 (exchange is an exception). In the hierarchy method disclosed here, the invention next considers level-2 domain balancing. Serifs can only be added in the outer layer 42 (see FIG. 4) and holes can only be introduced in the central band 41 (see FIG. 4). Similar to FIGS. 7E–7Q, the invention starts the domain balancing process at the inner corner L, as shown in FIG. 9D. There are six level-2 small squares (a, b, c, d, e, and f) which could contribute to the aerial image intensity at the inner corner point L. As discussed above, the situation around an edge point (which is far way from any corner) is the reference. For such an edge point, there are only four level-2 small squares, which contribute to the aerial image intensity at the edge point E. So, to achieve a domain balancing around the inner corner L, two of six small squares a, b, c, d, e, and f should become holes. However, small squares a and f are located in the inner side band 44 and can not become holes. Thus, two holes can only be formed at the locations of small squares b, c, d, and e. Forming a hole at either location b and/or e will make the hole 902 at the inner corner L too big. Thus, the small squares b and e are not a good choice. Consequently, the invention forms two small holes (each is of size s×s) at the locations of the small square c and d, and the results are shown in FIG. 9D. Note that, due to symmetry, another small hole of size s×s has also been formed in FIG. 9D (at the right half of the figure).

After the inner corner L, the domain balancing method considers the aerial image intensity at point V1 (see FIG. 9E), whose distance to the inner corner L is s. For the point V1, there are four level-2 small squares g, h, b, and cd which contributes to the aerial image intensity at point V1. Thus, without creating any additional serif or hole, the level-2 domain balancing is achieved at the edge point V1.

Figure 9E:
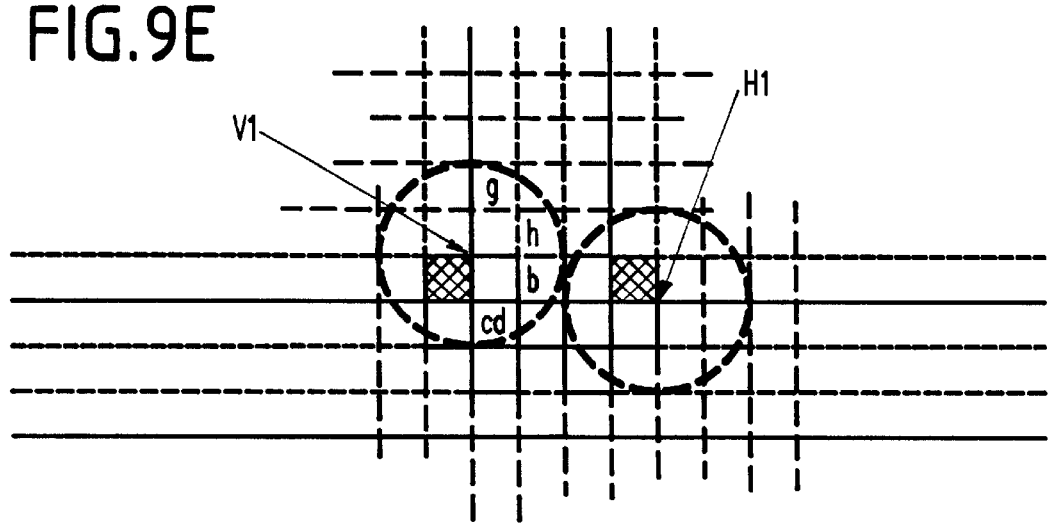
FIG. 9E is a schematic architectural diagram illustrating the OPC in layer 2.

FIG. 9E also shows that the level-2 domain balancing is also achieved for an edge point H1. Similarly, FIG. 9D discussed above also reveals that the level-2 domain balancing has also been achieved for an edge point H2, whose distance to the inner corner is 2s.

Figure 9F:
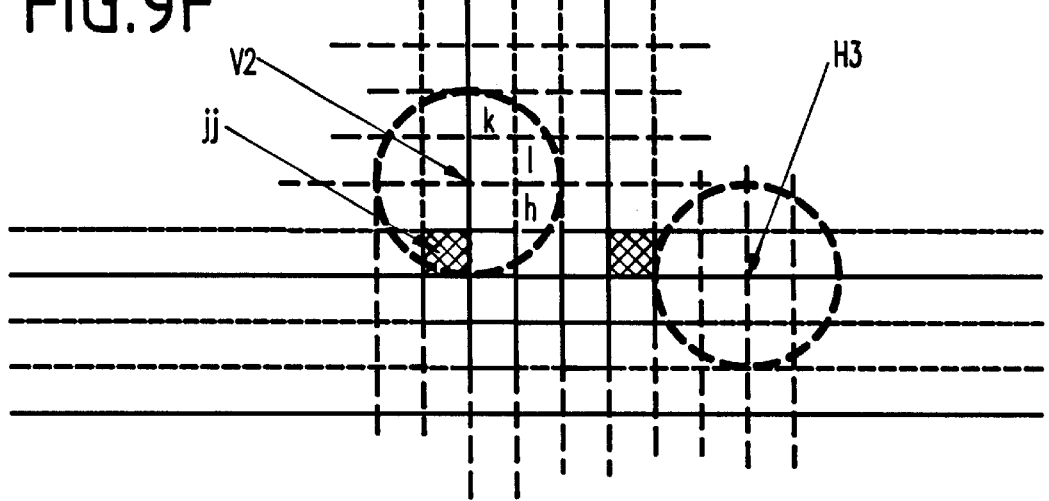
FIG. 9F is a schematic architectural diagram illustrating the OPC in layer 2.

After the edge point V1, the invention checks the next edge point V2, whose distance to the inner corner is 2s. As shown in FIG. 9F, there are exactly four level-2 small squares k, l, h, and jj which contributes to the aerial image intensity at the edge point V2. No more serif/hole is needed, and the level-2 domain balancing is achieved for the edge point V2. FIG. 9F also illustrates that the level-2 domain balancing is also automatically achieved for the edge point H3 as well as for any other edge points beyond H3. As can be easily recognized, serifs 904 in FIG. 9B are created by the mirroring-and-reversing method.

Figure 10A:
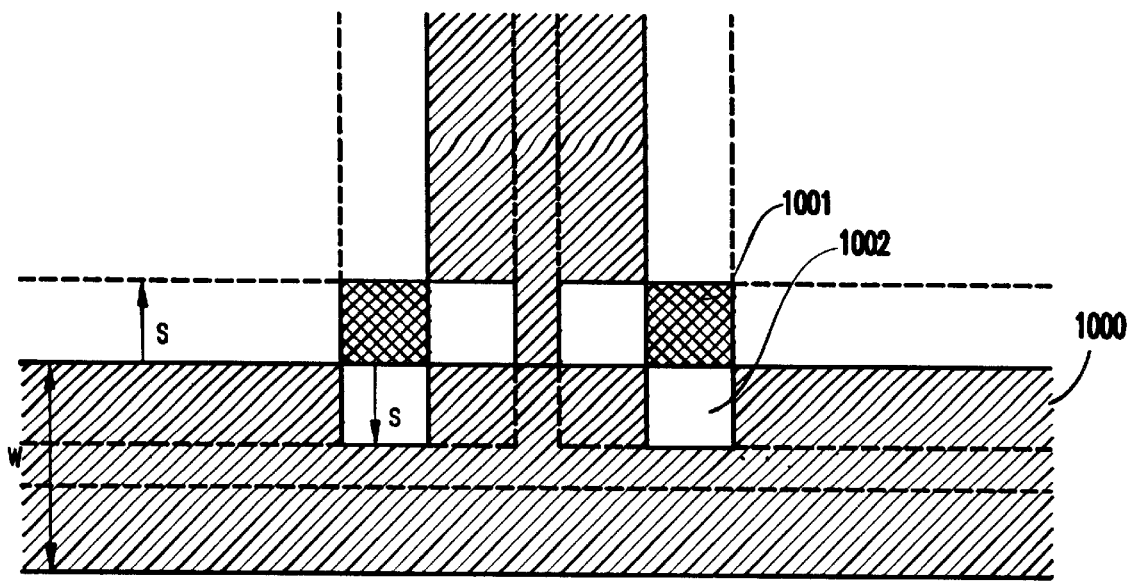
FIG. 10A is a schematic architectural diagram illustrating the same side band width as in FIG. 8A, but with a different serif/hole layout in the inner and outer side bands.
Figure 10B:
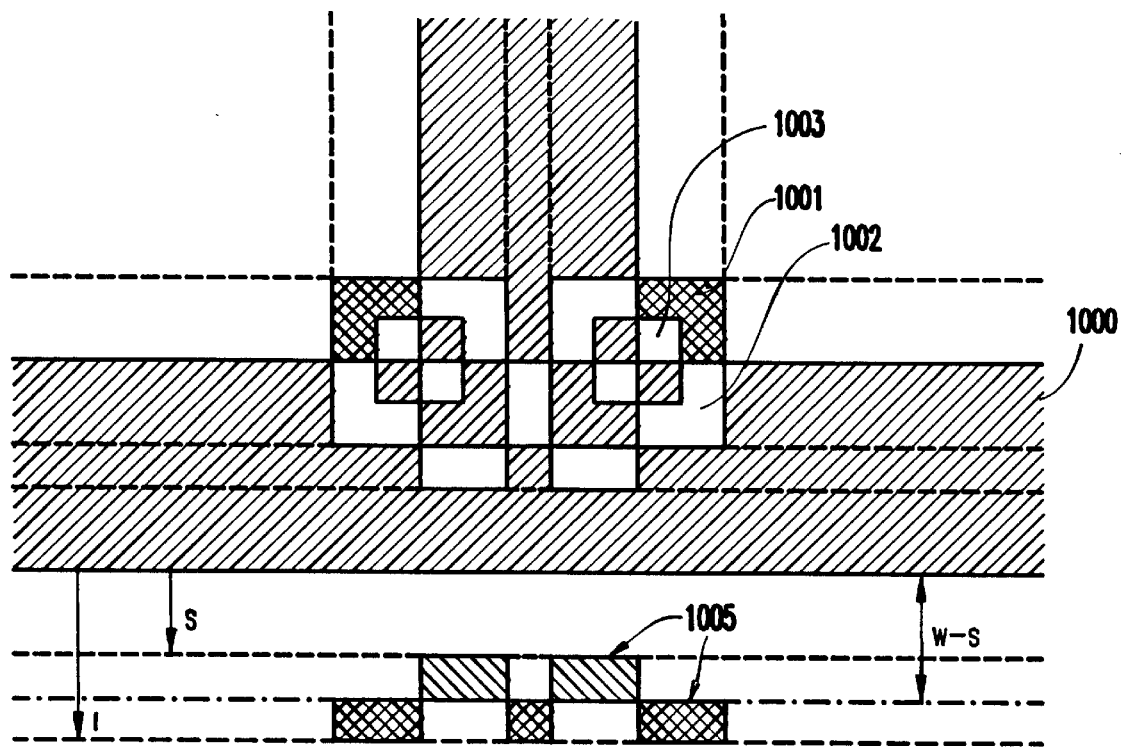
FIG. 10B is a schematic architectural diagram illustrating that the choice in 10A leads to a simpler final serif mask design.

FIG. 10A is another illustration of an inverted T-shaped mask 1000 where sideband width s is chosen as 2 w/5 (same as in FIG. 8) and the OPC has been made in the inner and outer side bands. FIG. 10B shows a final mask starting from the initial serif/hole design in FIG. 10A. In FIG. 10B smaller quadrants 1003 are formed at the interior corners by the method of exchange. Once again the diagonal quadrants 1003 are mirror images of each other. However, in this example, the invention alters the mask such that the smaller quadrants 1003 have an opposite transparency as the respective larger quadrant in which they sit (e.g. 1001, 1002 ). In addition, the reversing rule, discussed above, is applied after the formation of the smaller quadrants 1003 and produces the exterior serifs of 1005.

Figure 10C:
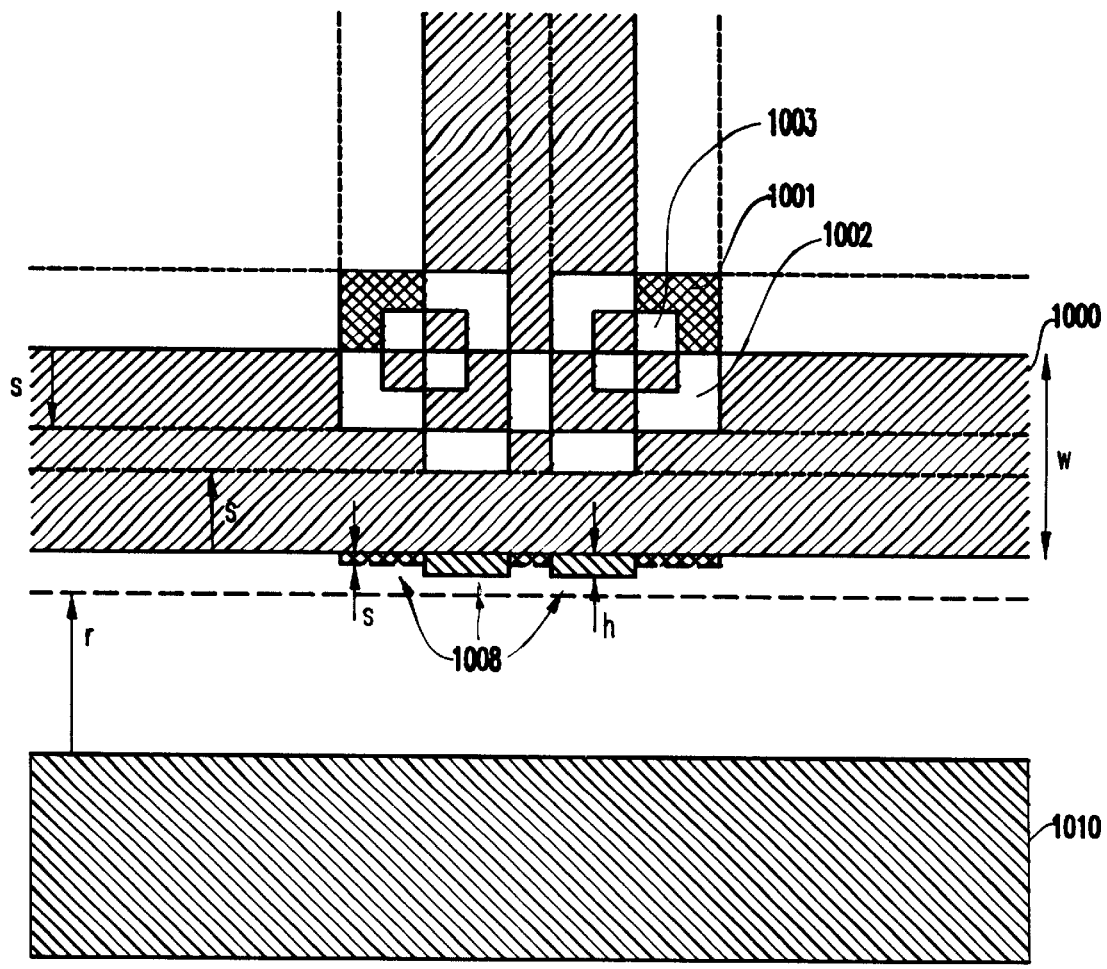
FIG. 10C is a schematic architectural diagram illustrating another way of balancing the mask around the lower edge the inverted T-shape mask.

FIG. 10C is a variation of the mask shown in FIG. 10B and includes the additional masking feature 1010. As discussed above with respect to FIGS. 7D, 8D, and 9C, the inventive methodology forms serifs 1008 at the lower edge of the inverted T shape mask and uses equations 1–4 to determine the sizes v and h.

Figure 11A:
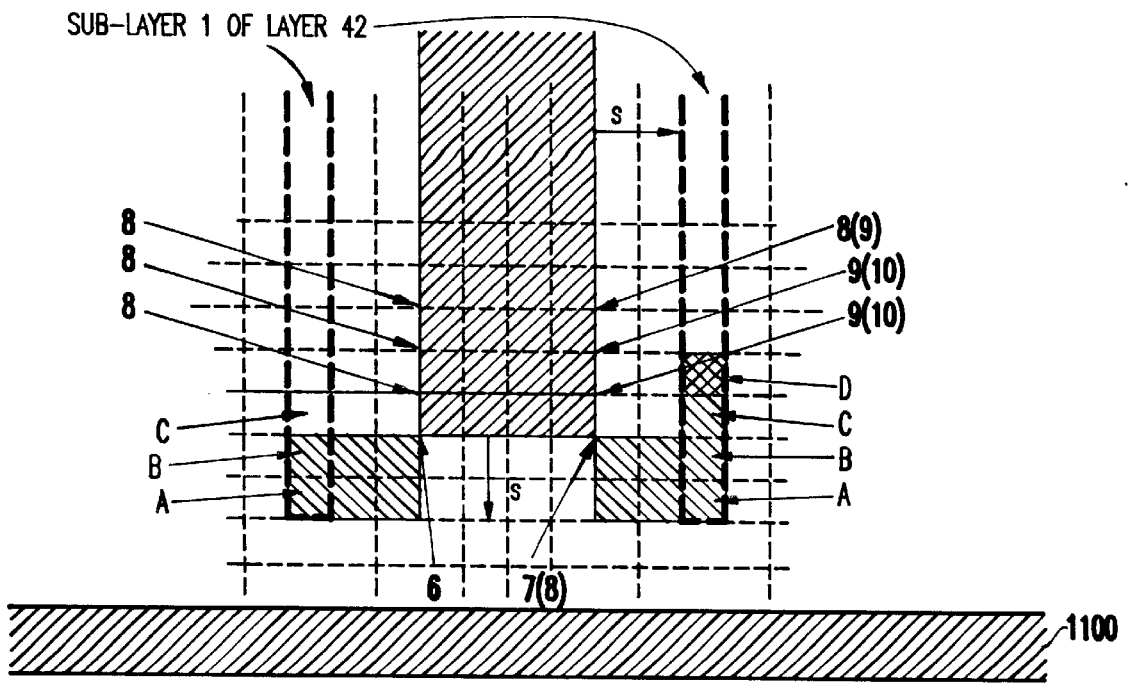
FIG. 11A is a schematic architectural diagram illustrating an enlarged FIG. 6A which aids in deciding whether to fill certain pixels.

FIG. 11A illustrates the balancing method of the invention in a more detailed way. More specifically, in FIG. 11A, the invention divides the square A into 4 smaller squares and then decides whether each of the smaller squares (e.g., pixels) should be filled or not.

More specifically, the invention determines whether a pixel should be made "filled" or not by performing a domain balancing in the inner sub-layer (sub-layer 1 ) of outer layer 42. As discussed above, the inner side bands 44 and the outer side bands 43 are already balanced. Sub-layer 1 of outer layer 42 of the vertical wire misses its part at the bottom, since that part has already occupied by outer side band 43 of the horizontal wire 1100 below it (e.g., see FIG. 6A). Pixels A and B within sub-layer 1 are already filled. The corner point still does not get enough intensity (6 level-2 pixels only).

To increase the intensity at the two corners, pixel C can be filled. The invention must determine whether pixel C should be filled or not. On the left edge in FIG. 11A, pixel C is not filled, the level-2 pixel number ranges from 6 to 8, or relatively it is (−2, 0) [i.e., from 2 less to even, since standard is 8 ]. On the right edge in FIG. 11A, pixel C is filled, level-2 pixel number ranges from 7 to 9, or relatively, it is (−1, +1) [i.e., range from one less than to one more than the standard 8]. This analysis determines that the pixel C should be filled. Next, the invention determines whether pixel D should be filled. If the pixel D is filled, then the number of level-2 pixels would range from 8 to 10 (numbers in parentheses) [i.e., from 0 to +2 relatively]. So, pixel D is better unfilled.

Figure 11B:
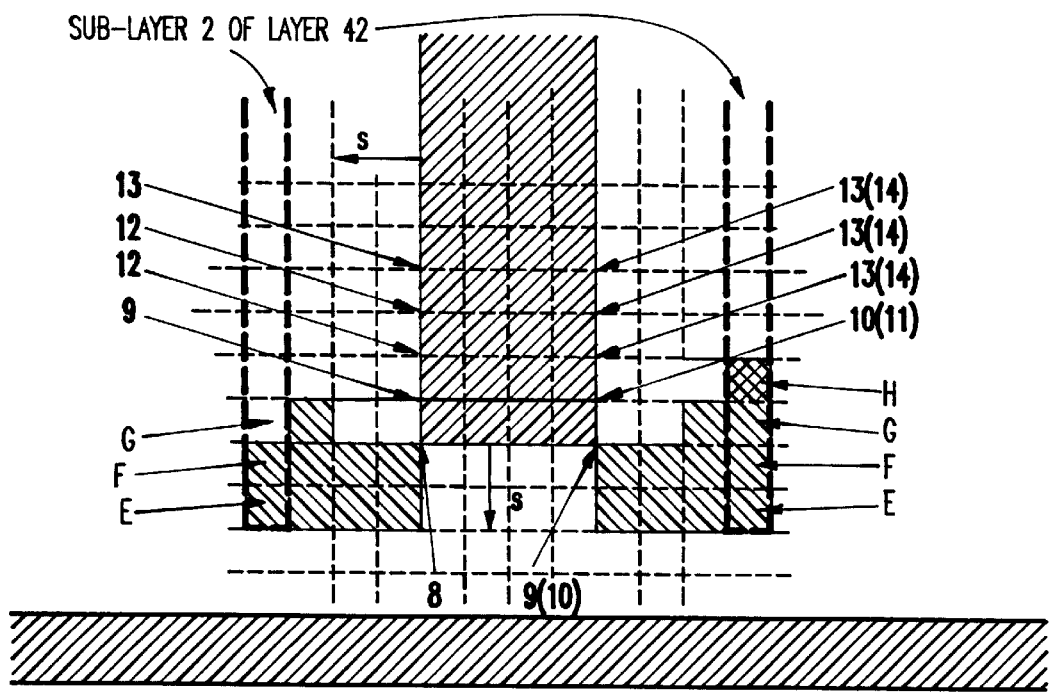
FIG. 11B is a schematic architectural diagram illustrating the inventive judging of whether to fill certain pixels.

For the outer sub-layer (sub-layer 2 ) of outer layer 42 shown in FIG. 11B, the invention first determines whether pixel G should be filled. Without filling pixel G, the level-2 count for sample points on the left edge ranges from 8 to 13, i.e., ranges from −4 to +1 relatively (where the standard is 12). With pixel G filled, the level-2 pixel count for the sample points on the right edge ranges from 9 to 13, i.e., ranges from −3 to +1 relatively. Thus, pixel G should be filled. Next, the invention determines whether pixel H should be filled or not. If pixel H is filled, then the level-2 pixel count for sample points on the right edge ranges from 10 to 14 (numbers in parentheses), i.e., ranges from −2 to +2 relatively. So, the pixel H will be filled.

Figure 17:
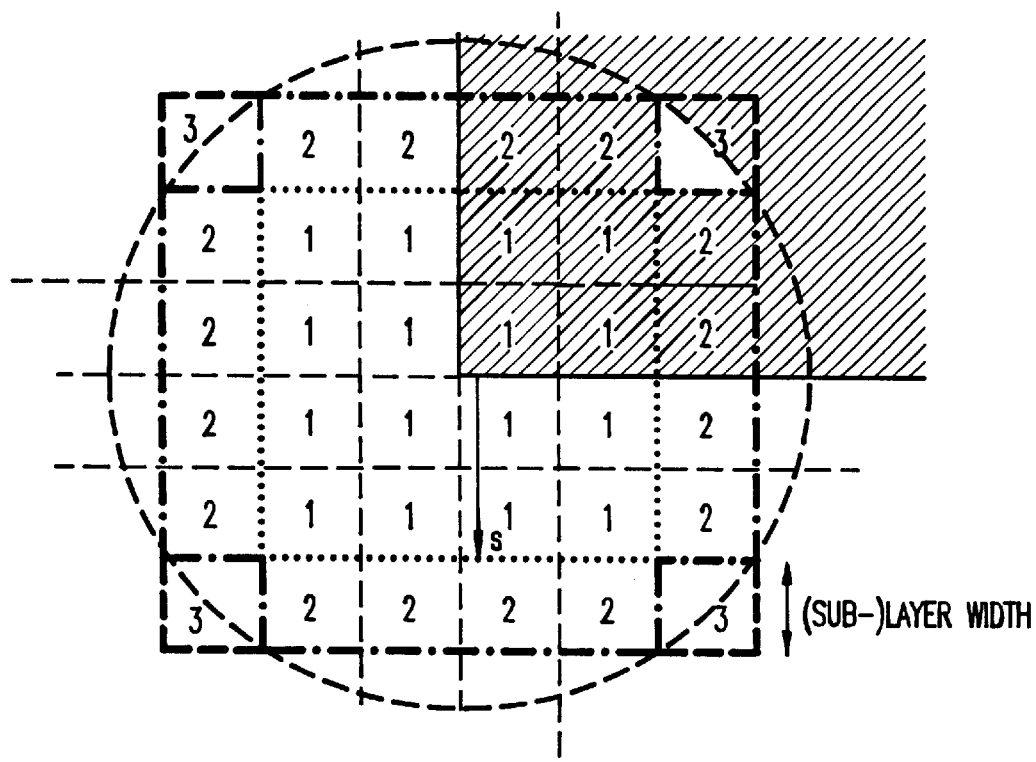
FIG. 17 is a schematic diagram illustrating pixels of different levels (level-1, level-2, and level-3 pixels) when (sub-) layer width equals half of side band width.

The above algorithm assumes that each level-2 pixel in FIG. 17 provides the same contribution. A more accurate method is to assign a weight to each level-2 pixel according to its distance to the center and the shape of the kernel function K. In a computer software, a weighted level-2 pixel count can be easily calculated. It is obvious many other serif mask design can be easily constructed based on the inventive hierarchy and domain-balancing serif mask design rules.

Figure 18:
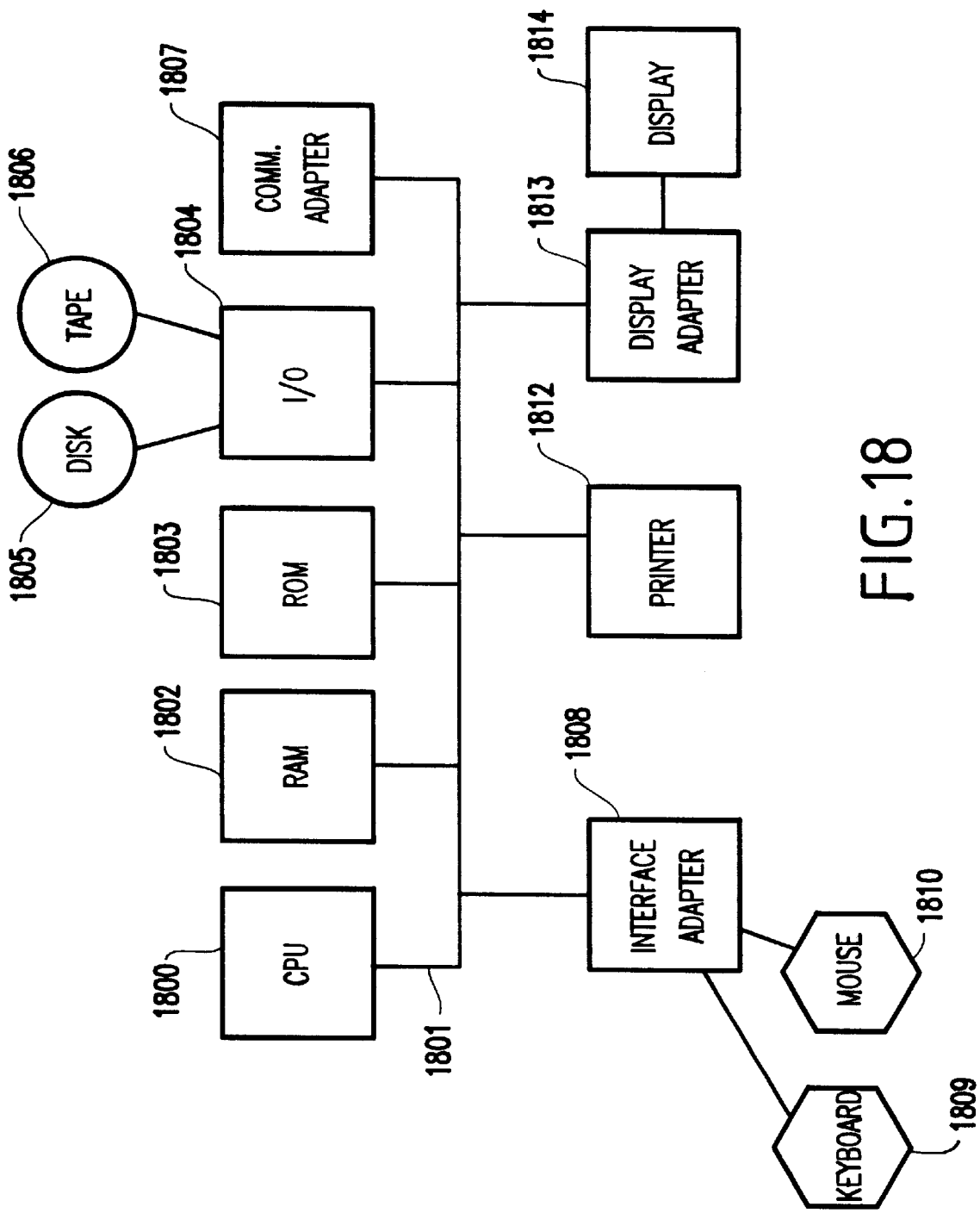
FIG. 18 is a schematic diagram of a hardware embodiment of the invention.

While the overall methodology of the invention is described above, the invention can be embodied in any number of different types of systems and executed in any number of different ways, as would be known by one ordinarily skilled in the art. For example, as illustrated in FIG. 18, a typical hardware configuration of an information handling/computer system in accordance with the invention preferably has at least one processor or central processing unit (CPU) 1800. For example, the central processing unit 1800 could include various image/texture processing units, mapping units, weighting units, classification units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, filtering, adding, subtracting, comparing, etc.

The CPU 1800 is interconnected via a system bus 1801 to a random access memory (RAM) 1802, read-only memory (ROM) 1803, input/output (I/O) adapter 1804 (for connecting peripheral devices such as disk units 1805 and tape drives 1806 to the bus 1801), communication adapter 1807 (for connecting an information handling system to a data processing network) user interface adapter 1808 (for connecting a peripherals 1809–711 such as a keyboard, mouse, imager, microphone, speaker and/or other interface device to the bus 1801), a printer 1812, and display adapter 1813 (for connecting the bus 1801 to a display device 1814). The invention could be implemented using the structure shown in FIG. 18 by including the inventive method, described above, within a computer program stored on the storage device 1805. Such a computer program would act on a mask design supplied through the interface units 1809–1811 or through the network connection 1807. The system would then automatically perform OPC and output the mask design on the display 1814, through the printer 1812 or back to the network 1807.

While the invention has been described in terms of preferred embodiments, those skilled in the art will recognize that the invention can be practiced with modification within the spirit and scope of the appended claims.

What is claimed is:

1. A method for performing optical proximity correction in a photolithographic mask comprising:

defining an inner band within a mask structure on said photolithographic mask, said inner band being adjacent an edge of said mask structure;

defining an outer band outside said mask structure and adjacent said edge of said mask structure;

changing a transparency of said mask structure to correct for optical proximity errors using predefined transparency changes;

determining whether said predefined transparency changes affect said outer band of said mask structure; and altering said predefined transparency changes to prevent said predefined transparency changes from affecting said outer band.

2. The method in claim 1, wherein said predefined transparency changes comprise one of forming a hole within said mask structure at interior right angles of said mask structure and forming a serif external to said mask structure at exterior right angles of said mask structure.

3. The method in claim 1, wherein said altering comprises changing a transparency of said inner band and said outer band to form a negative complementary image along said edge of said mask structure.

4. The method in claim 1, wherein said altering comprises identifying quadrants around corners of said mask structure and changing a transparency of said quadrants to form mirror images between diagonal quadrants.

5. The method in claim 1, wherein said altering comprises adding a series of holes within said inner band.

6. The method in claim 5, wherein said series of holes decrease in size depending upon a positional distance from a corner of said mask structure.

7. The method in claim 1, wherein said determining includes balancing aerial image intensity of a point along said edge and a corner of said mask structure.

8. A method for performing optical proximity correction in a photolithographic mask comprising:

defining inner bands within mask structures on said photolithographic mask, said inner bands being adjacent edges of said mask structures;

defining outer bands outside said mask structures and adjacent said edges of said mask structures;

changing a transparency of said mask structures to correct for optical proximity errors using predefined transparency changes;

determining whether said predefined transparency changes on a first mask structure affect outer bands of other mask structures on said photolithographic mask; and altering said predefined transparency changes to prevent said predefined transparency changes from affecting said outer bands of said other mask structures.

9. The method in claim 8, wherein said predefined transparency changes comprise one of forming a hole within said mask structures at interior right angles of said mask structures and forming a serif external to said mask structures at exterior right angles of said mask structure.

10. The method in claim 8, wherein said altering comprises changing a transparency of said inner bands and said outer bands to form a negative complementary image along each edge of said mask structures.

11. The method in claim 8, wherein said altering comprises identifying quadrants around corners of said mask structures and changing a transparency of said quadrants to form mirror images between diagonal quadrants.

12. The method in claim 8, wherein said altering comprises adding a series of holes within said inner bands.

13. The method in claim 12, wherein said series of holes decrease in size depending upon a positional distance from a corner of said mask structures.

14. The method in claim 8, wherein said determining includes balancing aerial image intensity of a point along an edge and a corner of each of said mask structure.

15. A method for performing optical proximity correction in a photolithographic mask comprising:

defining inner bands within mask structures on said photolithographic mask, said inner bands being adjacent edges of said mask structures;

defining central bands within said inner bands;

defining outer bands outside said mask structures and adjacent said edges of said mask structures;

defining proximity bands outside said outer bands;

changing a transparency of said mask structures to correct for optical proximity errors using predefined transparency changes;

determining whether said predefined transparency changes on a first mask structure affect outer bands and proximity bands of other mask structures on said photolithographic mask; and altering said predefined transparency changes to prevent said predefined transparency changes from affecting said outer bands and said proximity bands of said other mask structures.

16. The method in claim 15, wherein said predefined transparency changes comprise one of forming a hole within said mask structures at interior right angles of said mask structures and forming a serif external to said mask structures at exterior right angles of said mask structure.

17. The method in claim 15, wherein said altering comprises changing a transparency of said inner bands, said central bands, said outer bands and said proximity bands to form a negative complementary image along each edge of said mask structures.

18. The method in claim 15, wherein said altering comprises identifying quadrants around corners of said mask structures and changing a transparency of said quadrants to form mirror images between diagonal quadrants.

19. The method in claim 15, wherein said altering comprises adding a series of holes within said inner bands and said central bands.

20. The method in claim 19, wherein said series of holes decrease in size depending upon a positional distance from a corner of said mask structures.

21. The method in claim 15, wherein said determining includes balancing aerial image intensity of a point along an edge and a corner of each of said mask structure.

22. A program storage device readable by machine, tangibly embodying a program of instructions executable by the machine to perform a method of optical proximity correction in a photolithographic mask, said method comprising:

defining an inner band within a mask structure on said photolithographic mask, said inner band being adjacent an edge of said mask structure;

defining an outer band outside said mask structure and adjacent said edge of said mask structure;

changing a transparency of said mask structure to correct for optical proximity errors using predefined transparency changes;

determining whether said predefined transparency changes affect said outer band of said mask structure; and altering said predefined transparency changes to prevent said predefined transparency changes from affecting said outer band.

23. The program storage device in claim 22, wherein said predefined transparency changes comprise one of forming a hole within said mask structure at interior right angles of said mask structure and forming a serif external to said mask structure at exterior right angles of said mask structure.

24. The program storage device in claim 22, wherein said altering comprises changing a transparency of said inner band and said outer band to form a negative complementary image along said edge of said mask structure.

25. The program storage device in claim 22, wherein said altering comprises identifying quadrants around corners of said mask structure and changing a transparency of said quadrants to form mirror images between diagonal quadrants.

26. The program storage device in claim 22, wherein said altering comprises adding a series of holes within said inner band.

27. The program storage device in claim 26, wherein said series of holes decrease in size depending upon a positional distance from a corner of said mask structure.

28. The program storage device in claim 22, wherein said determining includes balancing aerial image intensity of a point along said edge and a corner of said mask structure.

* * * * *